(12) United States Patent
Chiang et al.

(10) Patent No.: US 7,871,928 B2
(45) Date of Patent: Jan. 18, 2011

(54) METHODS FOR DISCRETIZED PROCESSING OF REGIONS OF A SUBSTRATE

(75) Inventors: Tony P. Chiang, San Jose, CA (US); David E. Lazovsky, San Jose, CA (US); Thomas R. Boussie, Santa Clara, CA (US); Alexander Gorer, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 12/435,332

(22) Filed: May 4, 2009

(65) Prior Publication Data

US 2009/0227049 A1    Sep. 10, 2009

Related U.S. Application Data

(63) Continuation of application No. 11/352,016, filed on Feb. 10, 2006, now Pat. No. 7,544,574.

(60) Provisional application No. 60/725,186, filed on Oct. 11, 2005.

(51) Int. Cl.
H01L 21/44 (2006.01)
H01L 21/00 (2006.01)

(52) U.S. Cl. ....................... 438/680; 438/485

(58) Field of Classification Search ............... 438/15, 438/297, 680, 795, 485, 513, 676; 427/569–579; 257/E21.521–E21.531
See application file for complete search history.

(56) References Cited

U.S. PATENT DOCUMENTS

| | | | |
|---|---|---|---|
| 6,045,671 A | 4/2000 | Wu et al. | |
| 6,180,049 B1 | 1/2001 | Jang et al. | |
| 6,190,424 B1 | 2/2001 | Koike | |
| 6,306,658 B1 | 10/2001 | Turner et al. | |
| 6,319,476 B1 | 11/2001 | Victor et al. | |
| 6,444,111 B1 | 9/2002 | Montgomery | |
| 6,758,951 B2 | 7/2004 | Giaquinta et al. | |
| 6,767,824 B2 | 7/2004 | Nallan et al. | |
| 7,544,574 B2 * | 6/2009 | Chiang et al. | 438/297 |
| 2002/0117701 A1 | 8/2002 | Sun et al. | |
| 2002/0142474 A1 | 10/2002 | LaGraff et al. | |
| 2004/0087177 A1 | 5/2004 | Colburn et al. | |
| 2004/0099213 A1 | 5/2004 | Adomaitis et al. | |
| 2004/0163758 A1 | 8/2004 | Kagan et al. | |
| 2004/0183116 A1 * | 9/2004 | Cho et al. | 257/303 |
| 2005/0158690 A1 | 7/2005 | Bi et al. | |
| 2005/0224897 A1 | 10/2005 | Chen et al. | |

(Continued)

OTHER PUBLICATIONS

I. Takeuchi et al, "Combinatorial synthesis and evaluation of epitaxial ferroelectric device libraries," Applied Physics Letters, vol. 73, No. 7, Aug. 17, 1998, pp. 894-896.*

(Continued)

Primary Examiner—Calvin Lee

(57) ABSTRACT

The present invention provides methods and systems for discretized, combinatorial processing of regions of a substrate such as for the discovery, implementation, optimization, and qualification of new materials, processes, and process sequence integration schemes used in integrated circuit fabrication. A substrate having an array of differentially processed regions thereon is processed by delivering materials to or modifying regions of the substrate.

19 Claims, 17 Drawing Sheets

U.S. PATENT DOCUMENTS

| | | |
|---|---|---|
| 2005/0271795 A1 | 12/2005 | Moini et al. |
| 2007/0082485 A1 | 4/2007 | Chiang et al. |
| 2007/0082508 A1 | 4/2007 | Chiang et al. |
| 2007/0089857 A1 | 4/2007 | Chiang et al. |

OTHER PUBLICATIONS

Office Actions for U.S. Appl. No. 11/352,077 Dated Jun. 19, 2009 and Dec. 10, 2009.
Office Action for U.S. Appl. No. 12/028,666 Dated Apr. 29, 2010.
Office Actions for U.S. Appl. No. 12/029,379 Dated Sep. 21, 2009 and May 26, 2010.
Office Action for U.S. Appl. No. 12/030,022 Dated May 27, 2010.
Office Actions for U.S. Appl. No. 11/352,083 Dated Feb. 12, 2009; Sep. 3, 2009, and Apr. 13, 2010.
Office Actions for U.S. Appl. No. 11/351,978 Dated Apr. 8, 2009 and Mar. 29, 2010.
Office Action for U.S. Appl. No. 11/674,132 Dated Mar. 31, 2010.
Office Actions for U.S. Appl. No. 11/674,137 Dated Jul. 21, 2009 and May 9, 2010.
Office Action for U.S. Appl. No. 11/352,077 dated Jul. 22, 2010.
Office Action for U.S. Appl. No. 12/028,666 dated Oct. 29, 2010.
Office Action for U.S. Appl. No. 11/418,689 dated Sep. 15, 2010.
Notice of Allowance for U.S. Appl. No. 11/352,083 dated Oct. 12, 2010.
Office Action for U.S. Appl. No. 11/674,132 dated Sep. 13, 2010.
Office Action for U.S. Appl. No. 11/674,137 dated Oct. 4, 2010.

* cited by examiner

US 7,871,928 B2

METHODS FOR DISCRETIZED PROCESSING OF REGIONS OF A SUBSTRATE

RELATED APPLICATIONS

This application is a continuation of U.S. patent application Ser. No. 11/352,016 filed Feb. 10, 2006 now U.S. Pat. No. 7,544,574 and also claims the benefit of U.S. Provisional Patent Application No. 60/725,186, filed Oct. 11, 2005.

FIELD OF THE INVENTION

This invention relates to the combinatorial processing of regions of a substrate, including thin film processing methods used in the manufacture of integrated circuits, semiconductor devices, flat panel displays, optoelectronic devices, data storage devices, magnetoelectronic devices, magnetooptic devices, molecular electronic devices, solar cells, photonic devices, packaged devices, and the like. In particular, the invention relates to discretized, combinatorial processing of and combinatorial process sequence integration performed within unique regions contained in and/or on a single monolithic substrate used in device fabrication.

BACKGROUND OF THE INVENTION

The manufacture of integrated circuits (IC), semiconductor devices, flat panel displays, optoelectronics devices, data storage devices, magnetoelectronic devices, magnetooptic devices, packaged devices, and the like entails the integration and sequencing of many unit processing steps. As an example, IC manufacturing typically includes a series of processing steps such as cleaning, surface preparation, deposition, lithography, patterning, etching, planarization, implantation, thermal annealing, and other related unit processing steps. The precise sequencing and integration of the unit processing steps enables the formation of functional devices meeting desired performance metrics such as speed, power consumption, and reliability.

The drive towards ever increasing performance of devices or systems of devices such as in systems on a chip (SOCs) has led to a dramatic increase in the complexity of process sequence integration and device integration, or the means by which the collection of unit processing steps are performed individually and collectively in a particular sequence to yield devices with desired properties and performance. This increase in complexity of device integration has driven the need for, and the subsequent utilization of increasingly complex processing equipment with precisely sequenced process modules to collectively perform an effective unit processing step. For example, an advanced integrated copper barrier and seed deposition tool will include a degas module, a preclean module, a barrier deposition module, a seed deposition module, a cool module, and combinations thereof. Collectively, the integration of precise modules in a precise sequence allows the copper barrier and seed layers to be deposited effectively. In another example, an advanced copper electroplating tool may include a surface preparation module, an electroplating module, a spin rinse dry module, a thermal annealing module, and combinations thereof. In yet another example, an integrated copper chemical mechanical planarization (CMP) tool may include a copper polish module, a barrier polish module, a cleaning module, a rinse/dry module, and combinations thereof.

The precise sequencing of the unit processing tools, in addition to the unit process modules within each tool, must be properly sequenced and integrated. As an example, for a typical copper interconnect process flow used in IC manufacturing, a monolithic substrate or wafer processed within the copper barrier and seed deposition tool is followed by subsequent processing in a separate electroplating tool to substantially form the bulk copper metal deposition and will then be processed in a separate CMP tool for planarization, which includes the removal of excess unwanted bulk copper and barrier layer conductor films.

In addition to the increasingly challenging process sequence integration requirements, the tools and equipment employed in device manufacturing have been developed to enable the processing of ever increasing substrate sizes such as the move from 4" to 6", to 8" (or 200 mm), and now to 12" (or 300 mm) diameter wafers in order to fit more ICs per substrate per unit processing step for productivity and cost benefits. Other methods of increasing productivity and decreasing manufacturing costs have been to use batch reactors whereby multiple monolithic substrates can be processed in parallel. A common theme has been to process the entire monolithic substrate or batch substrates uniformly, in the same fashion with the same resulting physical, chemical, electrical, and the like properties across the monolithic substrate.

The ability to process uniformly across an entire monolithic substrate and/or across a series of monolithic substrates is advantageous for manufacturing cost effectiveness, repeatability and control when a desired process sequence flow for IC manufacturing has been qualified to provide devices meeting desired yield and performance specifications. However, processing the entire substrate can be disadvantageous when optimizing, qualifying, or investigating new materials, new processes, and/or new process sequence integration schemes, since the entire substrate is nominally made the same using the same material(s), process(es), and process sequence integration scheme. Conventional full wafer uniform processing results in fewer data per substrate, longer times to accumulate a wide variety of data and higher costs associated with obtaining such data.

As part of the discovery, optimization and qualification process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

In addition, there is a need to be able to perform such combinatorial process sequence integration testing in a fashion whereby a monolithic substrate can be previously and/or subsequently processed in a separate processing tool(s) within a particular manufacturing flow without the need to alter or modify the separate processing tool and/or process(es) employed in such separate tool. This serves to preserve the importance of the sequencing and interaction(s) with prior or subsequent process(es) performed in the separate process tool(s). Moreover, there is a need to be able to perform such combinatorial process sequence integration testing without the need for creating a specialized substrate to facilitate such combinatorial testing, but instead, to employ substrates and process flows used directly in the manufacture of the desired ICs themselves. This expands upon the more limited capability of testing specific materials properties in specially designed isolated situations which do not capture directly how such materials and their processing relate to the subsequent material(s) and/or processing steps, and interactions thereof in the manufacture of a desired IC or device.

INCORPORATION BY REFERENCE

Each publication, patent, and/or patent application mentioned in this specification is herein incorporated by reference in its entirety to the same extent as if each individual publication, patent, and/or patent application was specifically and individually indicated to be incorporated by reference.

SUMMARY OF THE INVENTION

The present invention provides methods and systems for discretized, combinatorial processing of regions of a substrate for such purposes including the discovery, implementation, optimization and qualification of new materials, processes, and process sequence integration schemes used in integrated circuit fabrication. A substrate having an array of differentially processed regions thereon is processed by delivering materials to or modifying regions of the substrate. Processing includes physical modifications, chemical modifications, electrical modifications, thermal modifications, magnetic modifications, photonic modifications, and photolytic modifications, more specifically cleaning, surface modification, surface preparation, deposition, dispensing, reaction, functionalization, etching, planarization, chemical mechanical planarization, electrochemical mechanical planarization, lithography, patterning, implantation, irradiation, electromagnetic irradiation, microwave irradiation, radio frequency (RF) irradiation, thermal treatment, infrared (IR) treatment, ultraviolet (UV) treatment, deep ultraviolet (DUV) treatment, extreme ultraviolet (EUV) treatment, electron beam treatment, and x-ray treatment, and more specifically electrochemical deposition, electroless deposition, physical vapor deposition, chemical vapor deposition, atomic layer deposition, vapor phase epitaxy, liquid phase epitaxy, chemical beam epitaxy, molecular beam epitaxy, molecular self-assembly, and evaporation. Once processed, the regions of the substrate can be evaluated for useful properties including, for example, electrical, thermal, mechanical, morphological, optical, magnetic, chemical and other properties. As such, the present invention provides methods and systems for the combinatorial processing and analysis of regions of a substrate. Any processed region found to possess a useful property can be subsequently prepared on a large-scale.

One aspect is directed to a system for processing regions on a substrate. In one embodiment, the system includes a substrate having an array of discrete regions, wherein each region comprises a plurality of structures and/or devices, and a processing tool adapted to process each region of the substrate individually.

In another embodiment, the system includes a substrate having an array of regions, and a processing tool adapted to process each region of the substrate individually. The processing tool is adapted to perform at least one of cleaning, surface modification, surface preparation, etching, planarization, patterning, implantation, thermal treatment, infrared (IR) treatment, ultraviolet (UV) treatment, electron beam treatment, and x-ray treatment.

Another aspect of the present invention is directed to methods for forming an array of differentially processed regions on a substrate. In one embodiment, the method includes providing a substrate having an array of predefined regions that are similar to each other, wherein each region includes at least two different structures or devices, and processing at least a portion of two regions of the substrate differently from each other by providing a material to at least a portion of each region or modifying at least a portion of each region.

In another embodiment, the method includes providing a substrate, and processing at least a portion of two regions of the substrate differently from each other. The processing includes at least one of cleaning, surface modification, etching, planarization, patterning, implantation, infrared (IR) treatment, ultraviolet (UV) treatment, electron beam treatment, and x-ray treatment.

In yet another embodiment, the method includes providing a substrate, processing at least a portion of two regions of the substrate differently from each other and determining a property of the processed regions. The processing includes providing a material to at least a portion of the region or modifying at least a portion of the region. The property includes at least one of yield, leakage, operational frequency, switching speed, mobility, transconductance, drive current, threshold voltage, electrical resistance, charge density, stress migration, electromigration, bias thermal stress, and time dependent dielectric breakdown.

In yet another embodiment, the method includes providing a substrate having at least two discrete regions and forming layers on some of the discrete regions. Each of the discrete regions of the substrate includes a dielectric portion and an electrically conductive portion. The substrate of an embodiment can include a sufficient amount of space between the regions such that materials do not substantially interdiffuse between the regions. The method includes forming a masking layer on the dielectric portions of some of the discrete regions, but not on the electrically conductive portions of the discrete regions, and forming a capping layer on the electrically conductive portions of some of the discrete regions, but not on the dielectric portions of the regions. In one embodiment, the masking layers are different from each other and inhibit formation of material in the dielectric portions of each region. In another embodiment, the capping layers are different from each other.

In yet another embodiment, the method includes receiving a substrate from at least one first process selected from a group consisting of depositing, patterning, etching, cleaning, planarizing, and treating and generating a processed substrate by processing at least a portion of two areas of a substrate, the two areas being processed differently from each other. The processing includes modifying the portion of two areas using at least one of a plurality of processes, a process sequence, a plurality of processing conditions, and a plurality of processing sequence conditions, wherein at least one of the processes, process sequence, processing conditions, and processing sequence conditions is different in each of the portion of two areas.

In yet another embodiment, the method includes generating a processed substrate by processing at least a portion of two areas of the substrate, the two areas being processed differently from each other, and providing the processed substrate to at least one additional process selected from a group consisting of depositing, patterning, etching, cleaning, planarizing, and treating. The processing includes modifying the portion of two areas using at least one of a plurality of processes, a process sequence, a plurality of processing conditions, and a plurality of processing sequence conditions, wherein at least one of the processes, process sequence, processing conditions, and processing sequence conditions is different in each of the portion of two areas Another aspect of the present invention is directed to a substrate having at least two discrete regions. In one embodiment, each region comprising an electrically conductive portion and a dielectric portion. The substrate has a capping layer on the electrically conductive portion of at least one of the regions, and a masking layer on the dielectric portion of at least one of the regions. In these embodiments, at least one of the capping layers in the regions is different from another, or at least one of the masking layers in the regions is different another, or both at least one of the capping layers and at least one of the masking layers in the regions are different from each other.

In another embodiment, the substrate has at least a first and a second discrete region, the first discrete region has at least one area modified using a first set of process sequences and a first set of conditions, and the second discrete region has at least one area modified using a second set of process sequences and a second set of conditions. At least one process is different between the first and second set of process sequences, and at least one condition is different between the first and second set of conditions.

Other features, objects and advantages of the present invention will be in part apparent to those skilled in the art and in part pointed out hereinafter. All references cited in the instant specification are incorporated herein by reference for all purposes. Moreover, as the patent and non-patent literature relating to the subject matter disclosed and/or claimed herein is substantial, many relevant references are available to a skilled artisan that will provide further instruction with respect to such subject matter.

DETAILED DESCRIPTION OF THE INVENTION

Figure 1A:
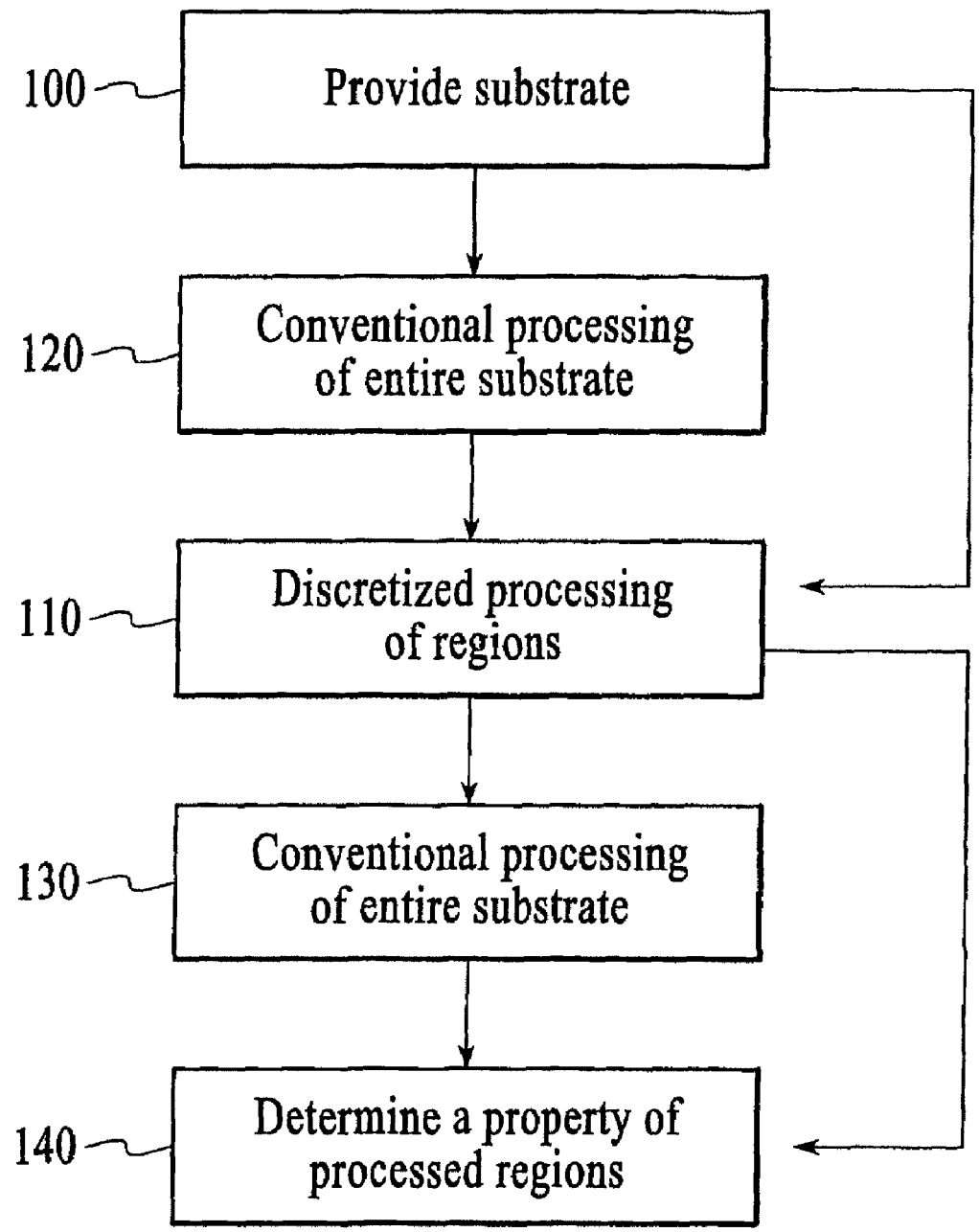
FIG. 1A is a flowchart illustrating a methodology for combinatorial process sequence integration in accordance with one embodiment of the present invention.

The following terms are intended to have the following general meanings as they are used herein.

The term "substrate" is used herein to refer to a material having a rigid, semi-rigid, or flexible surface. The substrate can also include a substance or material acted upon by another substance, material, and/or process. In one embodiment, the substrate can include supporting material(s) (such as a wafer) upon or within which a component or plurality of components (such as a test structure) is fabricated or to which a component is attached. In another embodiment, the substrate can include the supporting material(s) and the component(s). The substrate includes for example a plate, wafer, panel and/or disk of suitable material on and/or in which the components of a unit, such as an integrated or printed circuit, are deposited or formed. A flexible substrate can include plastic or polymeric material, for example flexible materials used in displays or other flexible IC applications. In many embodiments, at least one surface of the substrate will be substantially flat, although in some embodiments it may be desirable to physically separate synthesis regions for different materials with, for example, dimples, wells, raised regions, etched trenches, or the like. In some embodiments, the substrate itself contains wells, raised regions, etched trenches, etc. which form all or part of the processing regions.

The term "predefined region" is used herein to refer to a localized area on a substrate which is, was, or is intended to be used for processing or formation of a selected material and is otherwise referred to herein in the alternative as "known" region, a "selected" region, or simply a "region." The predefined region can include one region and/or a series of regular or periodic regions pre-formed on the substrate. The predefined region may have any convenient shape, e.g., circular, rectangular, elliptical, wedge-shaped, etc. In some embodiments, a predefined region and, therefore, the area upon which each process is performed or distinct material is synthesized, is smaller than about 25 $cm^2$, preferably less than 10 $cm^2$, more preferably less than 5 $cm^2$, even more preferably less than 1 $cm^2$, still more preferably less than 1 $mm^2$, and even more preferably less than 0.5 mm.

The term "radiation" is used herein to refer to energy which may be selectively applied including energy having a wavelength between $10^{-14}$ and $10^4$ meters including, for example, electron beam radiation, gamma radiation, x-ray radiation, ultraviolet radiation, visible light, infrared radiation, microwave radiation and radio waves. "Irradiation" refers to the application of radiation to a surface or emission of energy directed at a substrate.

As used herein, the term "processing material" is used herein to refer to each of the substances that are delivered to a region of a substrate for processing.

The term "process" or "processing" is used herein to refer to a finite course of actions, operations, events, and/or changes defined by purpose or effect. "Process" or "processing" is used herein to include, but not be restricted to, providing a processing material to a region and/or modifying a region. Processing specifically includes physical modifications, chemical modifications, electrical modifications, thermal modifications, magnetic modifications, photonic modifications, and photolytic modifications, more specifically cleaning, surface modification, surface preparation, deposition, dispensing, reaction, functionalization, etching, planarization, chemical mechanical planarization, electrochemical mechanical planarization, lithography, patterning, implantation, irradiation, electromagnetic irradiation, microwave irradiation, radio frequency (RF) irradiation, thermal treatment, infrared (IR) treatment, ultraviolet (UV) treatment, deep ultraviolet (DUV) treatment, extreme ultraviolet (EUV) treatment, electron beam treatment, and x-ray treatment, and more specifically electrochemical deposition, electroless deposition, physical vapor deposition, chemical vapor deposition, atomic layer deposition, vapor phase epitaxy, liquid phase epitaxy, chemical beam epitaxy, molecular beam epitaxy, molecular self-assembly, and evaporation. Processing conditions are those conditions, such as temperature, time, pressure, material phase, amount, component ratio, etc., under which processing occurs. "Process sequence" is used herein to refer to a series of processes performed in a unique order and/or combination to effect a desired end result, for example, to form or modify structures, test structures, devices, integrated circuits, etc. "Process sequence conditions" are those conditions such as temperature, time, pressure, material phase, amount, component ratio, etc., under which a sequence of processes occurs. "Combinatorial process sequence integration" is used herein to describe i) evaluating different materials, ii) evaluating different processing conditions, iii) evaluating different sequencing and integration of processes (with respect to both modules within a tool and to a plurality of tools in a process flow), and combinations thereof, for such used as in the manufacture of devices such as integrated circuits.

The term "device" is used herein to refer to a unit that is capable of performing some specific function. A device can include electrical, biological, and/or mechanical components, such as discrete electronic components. A device can also include components (e.g., transistor, resistor, diode, capacitor, etc.) of a particular type (e.g., electronic, magnetic, photonic, optoelectronic, magnetoelectronic, magenetooptic, molecular, etc.) on a substrate; which can be active or passive.

The term "structure" is used herein to refer to an arrangement, organization, and/or placement of one or more parts and/or elements. The structure can include topographical features, such as vias, holes, lines, trenches, and test structures, useful for extracting information about a process, identifying process problems, and improving a process as well as device performance. Test structures include device test structures, such as transistors, capacitors and diodes, process test structures, such as a 4-point probe structures, via chain structures, and continuity and isolation structures, circuit test structures, such as inverters and ring oscillators, and SEM test structures.

The present invention provides methods and apparatus for the combinatorial investigation of processing of and process sequence integration for regions contained on a single substrate used typically in device fabrication. The invention is described herein primarily with regard to processing of ICs, but can readily be applied in the processing of other types of devices and the investigation of new materials for such uses. Some types of substrates which can be processed in accordance with the methods of the present invention include, for example, blanket wafers, patterned wafers, and substrates including devices, functional chips, functional devices, and test structures. More particularly, substrates which can be processed in accordance with the methods of the present invention include, but are not limited to, semiconductor devices, flat panel displays, optoelectronic devices, data storage devices, magnetoelectronic devices, magnetooptic devices, molecular electronic devices, solar cells, photonic devices, and packaged devices, or other devices which will be apparent to those of skill in the art upon review of this disclosure.

In some embodiments, the regions of the substrate are processed using wet (i.e., liquid based) processing techniques, which include, for example, cleaning, surface modification, surface preparation, and deposition. Exemplary cleaning processes include, but are not limited to, etching, removal of metallic contamination, removal of organic contamination, and removal of oxides. Exemplary surface modification and preparation processes include, but are not limited to, modification of a surface chemical state, modification of surface bonding sites, modification of surface charge, modification of surface environment, and modification using one or more materials and/or classes of materials that suppress, accelerate, and/or catalyze reactions (these materials can be incorporated into any structure and/or material resulting from the reaction of which they are a component but are not so limited). Exemplary deposition processes include, but are not limited to, organic coating formation via self assembled monolayers (SAMs), polyelectrolytes, layer by layer polyectrolytes, surfactancts, nanoparticles, etc., electrochemical deposition and electroless deposition. Similar methodologies can be applied towards dry (e.g., plasma based, and gas and/or vapor phase) processing techniques, known to those of skill in the art.

The resulting substrate having an array of processed regions thereon will have a variety of uses. For example, once prepared, the substrate can be screened for materials having useful properties. Alternatively, the processed regions of the substrate can be screened for structures and devices having useful properties. Additionally, the substrate can be screened for processes, process sequences, and/or process sequence integrations that are useful for device optimization, development, performance, yield, integration, etc. Furthermore, the substrate once prepared can be provided to one or more other processes, for example follow-on processing of the substrate and/or processes which incorporate the processed substrate into other components. Accordingly, the array of processed regions is preferably on a single substrate. By processing the array of regions on a single substrate, screening the array for regions having useful properties is more easily carried out and efficient.

Properties which can be screened for include, for example, optical properties, chemical composition, chemical reactivity, electrical properties, physical properties, magnetic properties, thermal properties, structural properties and mechanical properties. More particularly, properties which can be screened for include, for example, material location, material distribution, material thickness, material step coverage, material continuity, parametric testing for yield, via chain yield, line yield, via resistance, line resistance, Kelvin resistance, leakage, and capacitance, device testing for operational frequency, switching speed, power dissipation, mobility, transconductance, drive current, threshold voltage, capacitance, resistance, body effect, channel doping, sub-threshold behavior, and charge density, and reliability testing for stress migration, electromigration, bias thermal stress, thermal stress, mechanical stress, environmental stress of at least one environmental parameter, and time dependent dielectric breakdown. Other properties include conductivity, superconductivity, thermal conductivity, anisotropy, hardness, crystallinity, optical transparency, magnetoresistance, permeability, frequency doubling, photoemission, coercivity, critical current, or other useful properties which will be apparent to those of skill in the art upon review of this disclosure. Importantly, the processing and screening of a diverse array of process conditions enables the evaluation of new compositions with new physical properties, new processes, new process conditions, new process sequences, new process sequence integrations, etc., for use in such fields as chip manufacturing. Any process found to improve current materials/processes can be subsequently processed on a large-scale. It will be apparent to those of skill in the art that once identified using the methods of the present invention, a variety of different methods can be used to process such useful materials/processing/process sequence integration on a large or batch scale with essentially the same properties. The methods and systems described herein thus can be used in processes to effect combinatorial process sequence integration and as such are not limited to material/process characterization.

In some embodiments of the present invention, methods are used to analyze variations in process steps or sequences, such as lithographic steps, dry etch steps, deposition steps, or CMP. For example, as is well known in the art, the CMP process is often used to planarize structures that build up during multilevel deposition processes. These structures can be used as damascene interconnects, conductive plugs, or for other purposes. The CMP process is important to copper metallization, since copper cannot be easily dry-etched (the etch products being non-volatile), but is readily processed using CMP. However, the CMP process may polish away functioning circuit parts through dishing (leading to opens) or copper smearing (leading to shorts) when the circuit layout changes drastically in density, pitch and or in the horizontal aspect ratio (length:width) or under certain CMP process conditions. The ability of the system of the present invention to investigate variations in processes, such as the CMP process, as well as processes for processing of the regions prior to CMP, will lead to optimal process conditions to overcome the aforementioned problems in a timely, more cost-effective manner.

Also, for example, resists for lithography processes are requiring smaller and smaller sizes. For <100 nm feature size pattern transfer, line edge roughness becomes increasingly important. The methods and systems of the present invention described herein can be used to optimize the chemistries and processes and/or sequencing of processes required to achieve smooth pattern transfer. The systems and method of the present invention also have applications to finding new materials for and improving process conditions for materials utilized in chip fabrication processes, such as barrier layers, adhesion layers and seed layers.

The invention is described in further detail below with reference to the figures, in which like items are numbered the same in the several figures.

Generally, an array of regions is processed by delivering processing materials to predefined regions on a substrate and/or modifying the predefined regions. FIG. 1A is a flow-chart illustrating a methodology for combinatorial process sequence integration in accordance with one embodiment of the present invention. The embodiment may utilize a processing tool (which may or may not be an integrated tool comprised of discrete unit modules which collectively perform the effective unit process) that will perform the desired process for analysis. In one embodiment, the processing tool can perform the process in a discretized fashion within unique regions contained in a single monolithic substrate, such as a 300 mm diameter wafer used in IC manufacturing. The substrate is provided to the system 100, and is processed in a discretized, preferably isolated, fashion (either in a serial, parallel, or serial-parallel mode) whereby at least two regions of the substrate are processed differently from each other 110. The substrate processed in the aforementioned combinatorial fashion can optionally also be previously 120 and/or subsequently 130 processed in a conventional fashion with at least one process step, whereby the entire or substantially close to the entire substrate sees the same processing conditions. This allows the described combinatorial processing/combinatorial process sequence integration approach to be employed in desired segments of the process flow required to build an end device(s), integrated circuit, etc. The processed regions, such as devices or portions of devices created, can then be tested 140 for a property of interest using conventional methods for analysis, such as parametric testing for properties such as yield, via resistance, line resistance, capacitance, etc. and/or reliability testing for properties such as stress migration, electromigration, bias thermal stress, time dependent dielectric breakdown, and related testing known to those of skill in the art. The processed regions can be tested simultaneously, sequentially, or in a parallel-serial mode, where a first plurality of regions is simultaneously tested, followed by a second plurality of regions being simultaneously tested. The testing 140 is optionally performed in one or more alternative embodiments of the methodology for combinatorial process sequence integration.

The combinatorial process sequence integration of an embodiment uses a processing tool referred to herein as a site-isolated processing tool that will perform one or more processes. In one embodiment, the site-isolated processing tool processes a substrate in a discretized, isolated fashion (either in a serial, parallel, or serial-parallel mode) within unique regions of the substrate (e.g., at least two regions of the substrate are processed differently from each other). In processing an array of regions, as described herein, processing materials can be delivered to regions (including predefined regions) on a substrate and/or the regions (including predefined regions) can be modified using any number of site-isolated processing processes or sequences in combination with any number of conventional processing processes or sequences. For example, a method under the combinatorial process sequence integration herein receives a substrate from at least one first process selected from a group consisting of depositing, patterning, etching, cleaning, planarizing, implanting, and treating. The method generates a processed substrate by processing at least one region of the substrate differently from at least one other region of the substrate. The processing includes modifying the at least one region, wherein modifying includes at least one of physical modifications, chemical modifications, electrical modifications, thermal modifications, magnetic modifications, photonic modifications, and photolytic modifications, wherein the processing forms at least one array of differentially processed regions on the substrate. In one embodiment, the aforementioned processing includes modifying using at least one of materials, processing conditions, process sequences, process sequence integration, and process sequence conditions. In one other embodiment, the aforementioned processed substrate is provided to at least one additional process selected from a group consisting of depositing, patterning, etching, cleaning, planarizing, implanting, and treating.

As another example, a method under the combinatorial process sequence integration herein generates a processed substrate by processing at least one region of the substrate differently from at least one other region of the substrate. The processing includes modifying the at least one region, wherein modifying includes at least one of physical modifications, chemical modifications, electrical modifications, thermal modifications, magnetic modifications, photonic modifications, and photolytic modifications, wherein the processing forms at least one array of differentially processed regions on the substrate. The method continues by providing the processed substrate to at least one additional process selected from a group consisting of depositing, patterning, etching, cleaning, planarizing, implanting, and treating. In one embodiment, the aforementioned processing includes modifying using at least one of materials, processing conditions, process sequences, process sequence integration, and process sequence conditions.

Figure 1B:
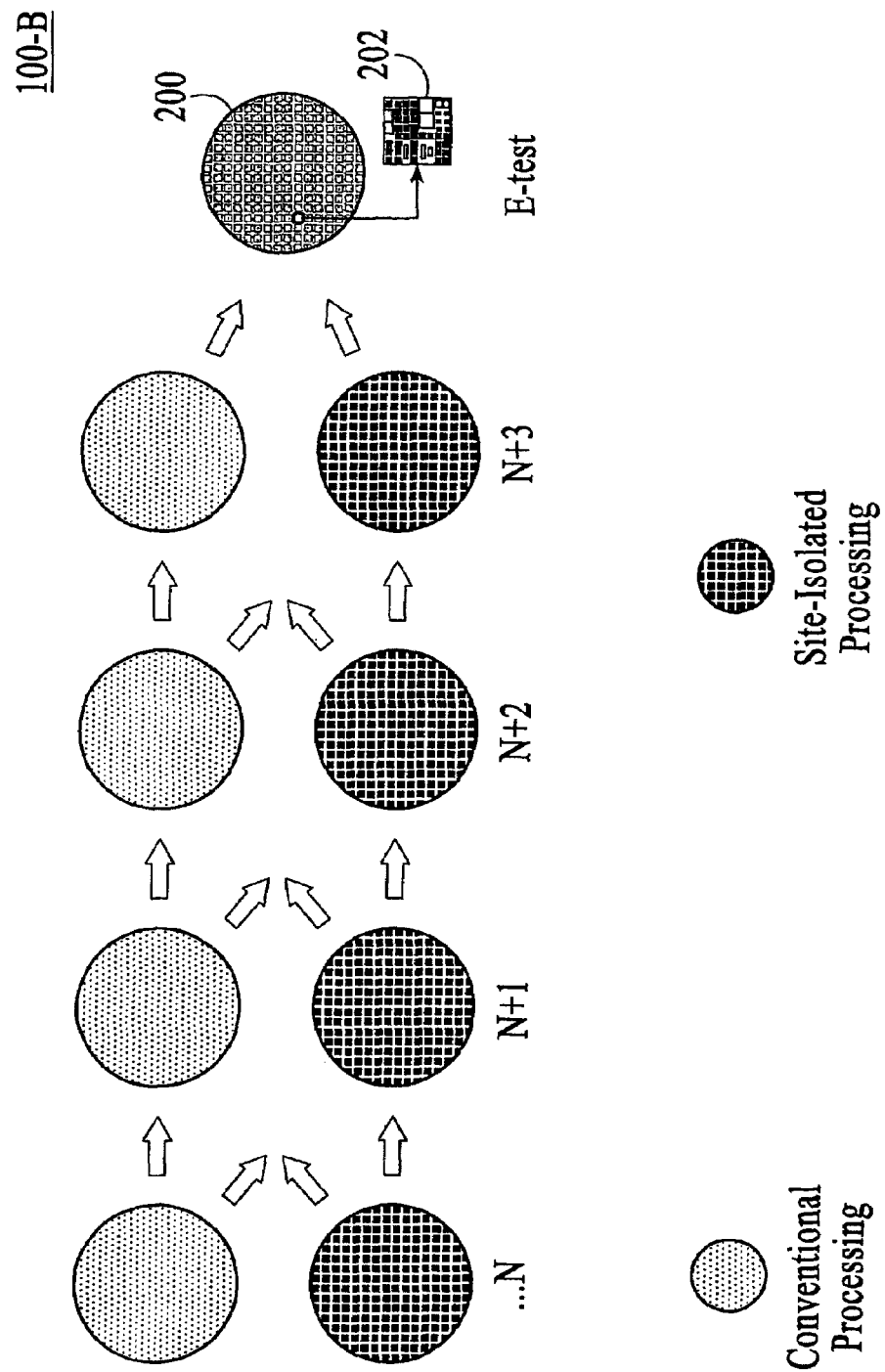
FIG. 1B is a flowchart illustrating a general methodology 100-B for combinatorial process sequence integration that includes site-isolated processing and/or conventional processing, under an embodiment.

FIG. 1B is a flowchart illustrating a general methodology 100-B for combinatorial process sequence integration that includes site-isolated processing and/or conventional processing, under an embodiment. One example of a processing sequence under the embodiments herein is as follows: process the substrate using Conventional Process N, then process the substrate using Site-Isolated Process N+1, then process the substrate using Site-Isolated Process N+2, then process the substrate using Conventional Process N+3, then perform E-test (e.g. electrical testing). Another example of a processing sequence under the embodiments herein is as follows: process the substrate using Site-Isolated Process N, then process the substrate using Site-Isolated Process N+1, then process the substrate using Conventional Process N+2, then process the substrate using Site-Isolated Process N+3, then perform E-test. Yet another example of a processing sequence under the embodiments herein is as follows: process the substrate using Site-Isolated Process N, then process the substrate using Conventional Process N+1, then process the substrate using Site-Isolated Process N+2, then process the substrate using Conventional Process N+3, then perform E-test. Various other processing sequences can be effected according to the methodology 100-B. The combinatorial process sequence integration thus generates for example a semiconductor wafer 200 comprising a die array that includes a plurality of dies 202 that can be test dies and/or actual product dies containing intended integrated circuitry. Blanket wafers, pattern wafers, devices, functional chips, functional devices, test structures, semiconductors, integrated circuits, flat panel displays, optoelectronic devices, data storage devices, magnetoelectronic devices, magnetooptic devices, molecular electronic devices, solar cells, photonic devices, and packaged devices can be processed and/or generated using the aforementioned combinatorial process sequence integration methodology. The combinatorial process sequence integration can be applied to any desired segment(s) and/or portion(s) of an overall process flow. Characterization, including electrical testing, can be performed after each process step, and/or series of process steps within the process flow as needed and/or desired.

Figure 1C:
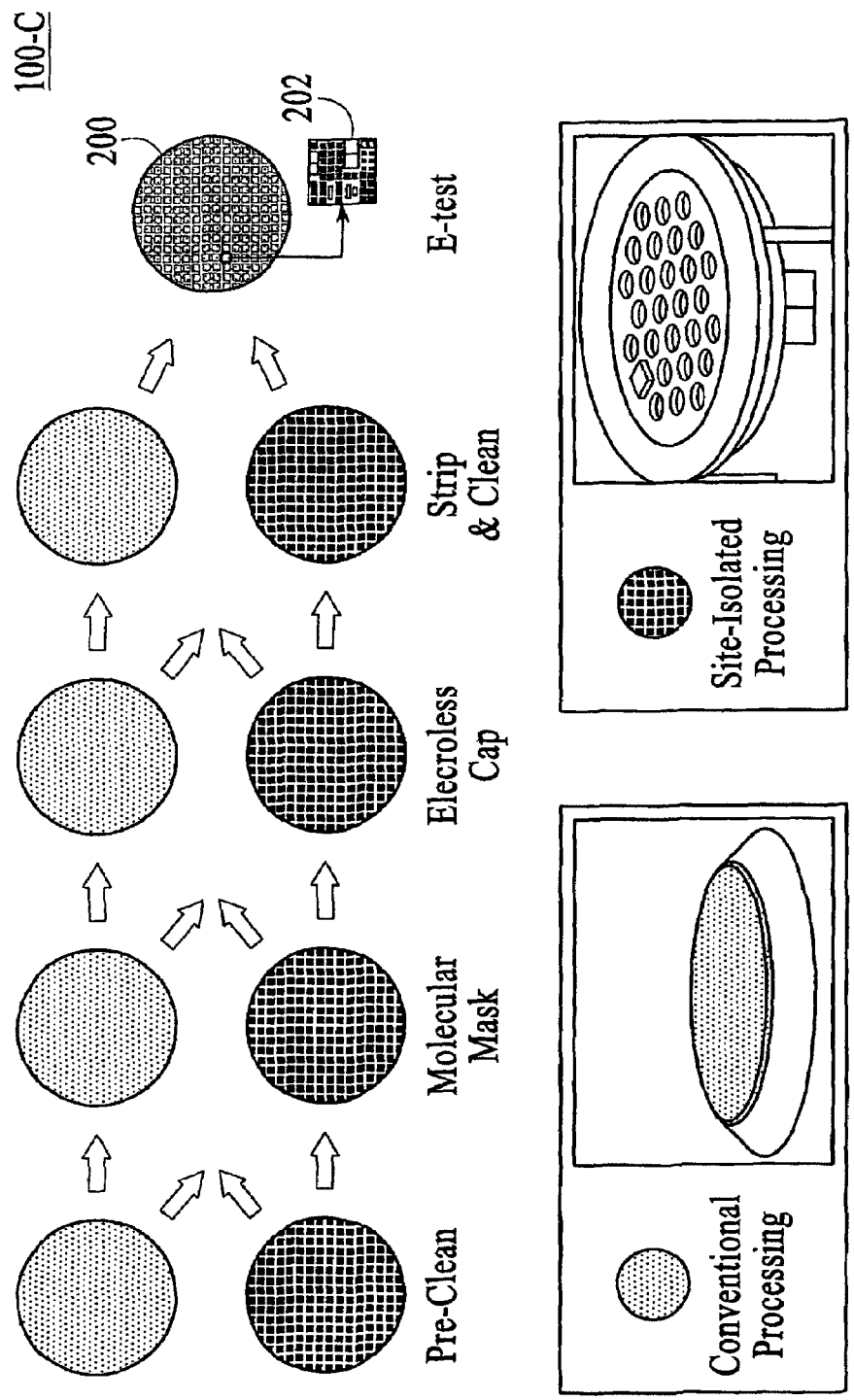
FIG. 1C is a flowchart illustrating a more specific methodology 100-C for combinatorial process sequence integration that includes site-isolated processing and/or conventional processing, under an embodiment.

FIG. 1C is a flowchart illustrating a more specific methodology 100-C for combinatorial process sequence integration that includes site-isolated processing and/or conventional processing, under an embodiment. One example of a processing sequence under the embodiments herein is as follows: process the substrate using Conventional Pre-clean, then process the substrate using Site-Isolated Molecular Mask, then process the substrate using Site-Isolated Electroless Cap, then process the substrate using Conventional Strip and Clean, then perform E-test. Another example of a processing sequence under the embodiments herein is as follows: process the substrate using Site-Isolated Pre-clean, then process the substrate using Site-Isolated Molecular Mask, then process the substrate using Conventional Electroless Cap, then process the substrate using Site-Isolated Strip and Clean, then perform E-test. Yet another example of a processing sequence under the embodiments herein is as follows: process the substrate using Site-Isolated Pre-clean, then process the substrate using Conventional Molecular Mask, then process the substrate using Site-Isolated Electroless Cap, then process the substrate using Conventional Strip and Clean, then perform E-test. Various other processing sequences can be effected according to the methodology 100-C.

In some methods of the present invention, processing materials are delivered to predefined regions on the substrate, and can be reacted using a number of different routes. For example, the processing materials can be reacted using, for example, solution based synthesis techniques, photochemical techniques, polymerization techniques, template directed synthesis techniques, epitaxial growth techniques, by the sol-gel process, by thermal, infrared or microwave heating, by calcination, sintering or annealing, by hydrothermal methods, by flux methods, by crystallization through vaporization of solvent, etc. Other useful reaction techniques that can be used to react the processing materials of interest will be readily apparent to those of skill in the art.

Since the regions of the substrate are processed independently of each other, the processing conditions at different regions can be controlled independently. As such, process material amounts, reactant solvents, processing temperatures, processing times, processing pressures, the rates at which the reactions are quenched, deposition order of process materials, process sequence steps, etc. can be varied from region to region on the substrate. Thus, for example, when exploring materials, a processing material delivered to a first and a second region can be the same or different. If the processing material delivered to the first region is the same as the processing material delivered to the second region, this processing material can be offered to the first and second regions on the substrate at either the same or different concentrations. This is true as well for additional processing materials delivered to the first and second regions, etc. As with the processing material delivered to the first and second regions, the additional processing materials delivered to the first and second regions can be the same or different and, if the same, can be offered to the first and second regions on the substrate at either the same or different concentrations. Moreover, within a given predefined region on the substrate, the processing materials can be delivered in either a uniform or gradient fashion. If the same processing materials are delivered to the first and second regions of the substrate at identical concentrations, then the conditions (e.g., reaction temperatures, reaction times, etc.) under which the regions are processed can be varied from region to region. Parameters which can be varied include, for example, material amounts, solvents, process temperatures, process times, the pressures at which the processes are carried out, the atmospheres in which the processes are conducted, the rates at which the processes are quenched, the order in which the materials are deposited, etc. Other process parameters which can be varied will be apparent to those of skill in the art.

Moreover, in one embodiment of the present invention, a method is provided for forming at least two different arrays of materials by delivering substantially the same processing materials at substantially identical concentrations to corresponding regions on both first and second substrates having different surfaces, such as a dielectric material surface and an electrically conductive surface, in order to represent different portions of regions on an IC chip, and, thereafter, subjecting the process materials on the substrates to a first set of process conditions. Using this method, the effects of the process parameters or materials on the various substrate surfaces can be studied and, in turn, optimized.

Substrate

The methods of the present invention are used to process an array of regions at known locations, preferably on a single substrate surface. Essentially, any conceivable substrate can be employed in the invention. The substrate can have any convenient shape, such a disc, square, sphere, circle, etc. The substrate is preferably flat, but may take on a variety of alternative surface configurations. For example, the substrate may contain raised or depressed regions on which the combinatorial processes take place. The substrate and its surface preferably form a rigid support on which to carry out the processing described herein. The substrate may be any of a wide variety of materials including, for example, polymers, plastics, Pyrex, quartz, resins, silicon, silica or silica-based materials, carbon, metals, inorganic glasses, inorganic crystals, membranes, etc. Other substrate materials will be readily apparent to those of skill in the art upon review of this disclosure. Surfaces on the solid substrate can be composed of the same materials as the substrate or, alternatively, they can be different, i.e., the substrates can be coated with, or contain a different material. Moreover, the substrate surface can contain thereon structures or devices. The most appropriate substrate and substrate-surface materials will depend on the processes to be performed and the selection in any given case will be readily apparent to those of skill in the art.

In some embodiments, a predefined region on the substrate or a portion of the region, and, therefore, the area upon which each process is carried out is smaller than about 25 cm$^2$, specifically less than 10 cm$^2$, more specifically less than 5 cm$^2$, even more specifically 1 cm$^2$, still more specifically less than 1 mm$^2$.

The processing materials utilized in the processing of the individual regions must often be prevented from moving to adjacent regions. Most simply, this can be ensured by leaving a sufficient amount of space between the regions on the substrate so that the various processing materials cannot interdiffuse between regions. Moreover, this can be ensured by providing an appropriate barrier between the various regions on the substrate during processing. In one approach, a mechanical device or physical structure defines the various regions on the substrate. A wall or other physical barrier, for example, can be used to prevent the materials in the individual regions from moving to adjacent regions. This wall or physical barrier may be removed after the synthesis is carried out. One of skill in the art will appreciate that, at times, it may be beneficial to remove the wall or physical barrier before screening the array of materials.

In other embodiments, the processing may be effected without the need of barriers which physically touch the substrate. For example, lasers, radiative lamps, UV radiation sources, other "point" sources can be used to process regions in a site addressable fashion as the area of modification is nominally smaller and/or equivalent in size to the discrete regions of interest on the substrate. In yet another embodiment, a physical barrier can be used to essentially screen and/or limit the processing to a desired region(s) and/or portion(s) of a region(s) wherein the physical barrier does not physically touch the substrate. For example, a physical barrier can be used to essentially block and/or restrict processing to certain region(s) and/or portion(s) or region(s). A screen, such as a mask or shutter, can be used to block vapor fluxes such as from PVD (i.e. sputtering) or evaporation sources for example. An opaque vs. transparent mask can be used to let certain radiation through the transparent regions to effect processing in specified regions on the substrate. In yet another embodiment, gas flows, of preferably an inert gas such as argon (Ar), can be used to screen out gaseous reagents and or limit the concentrations of such reagents so as to effectively screen out the effects of such reagents from certain regions. In this fashion, specific regions on a substrate can be processed differently without the need for a physical barrier in communication with the substrate. This approach is particularly amenable to sequential gas phase vacuum based surface kinetic processes such as atomic layer deposition and various forms thereof (e.g. ion, radical, and plasma induced/enhanced).

Some types of substrates which can be processed in accordance with the methods of the present invention include, for example, blanket wafers, patterned wafers, and substrates including devices, functional chips, functional devices, and test structures. More specifically, substrates which can be processed in accordance with the methods of the present invention include, but are not limited to, semiconductor devices, flat panel displays, optoelectronic devices, data storage devices, magnetoelectronic devices, magnetooptic devices, molecular electronic devices, solar cells, photonic devices, and packaged devices, or other devices which will be apparent to those of skill in the art upon review of this disclosure.

As is discussed more fully below, a myriad of different types of devices or structures, such as via chains and conductive lines can be located and/or processed within the discrete regions or portions thereof. Such structures can also include compact test elements such as contact arrays and elements designed to analyze specific process steps, such as chemical mechanical polishing.

Figure 2B:
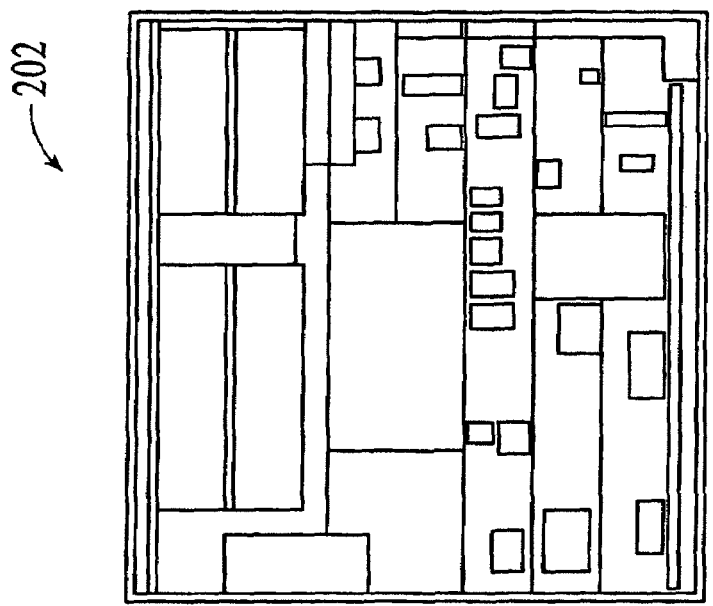
FIG. 2B is a blown-up view of one die of the die array shown in FIG. 2A.
Figure 2A:
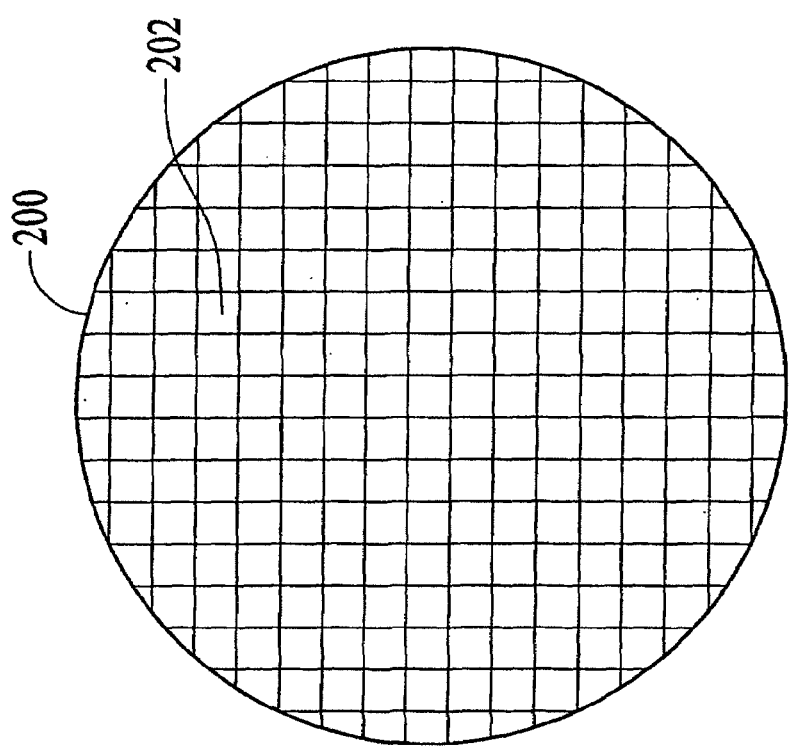
FIG. 2A is a top view of a semiconductor wafer comprising a die array that is used in accordance with the principles of one embodiment of the present invention.

Processing of the regions is preferably performed in a discretized fashion within unique regions contained in a single monolithic substrate 200 as shown in FIG. 2A, which, in one embodiment is a 300 mm diameter wafer used in IC manufacturing. The number of unique regions 202 is typically greater than two, and more specifically, the number of regions will correspond to the number of dies on the wafer.

FIGS. 2A and 2B illustrate a semiconductor wafer 200 comprising a die array that is used in accordance with the principles of one embodiment of the present invention. As illustrated in FIG. 2A, the substrate 200 may be comprised of a plurality of dies 202 that can be test dies and/or actual product dies containing intended integrated circuitry.

Figure 2C:
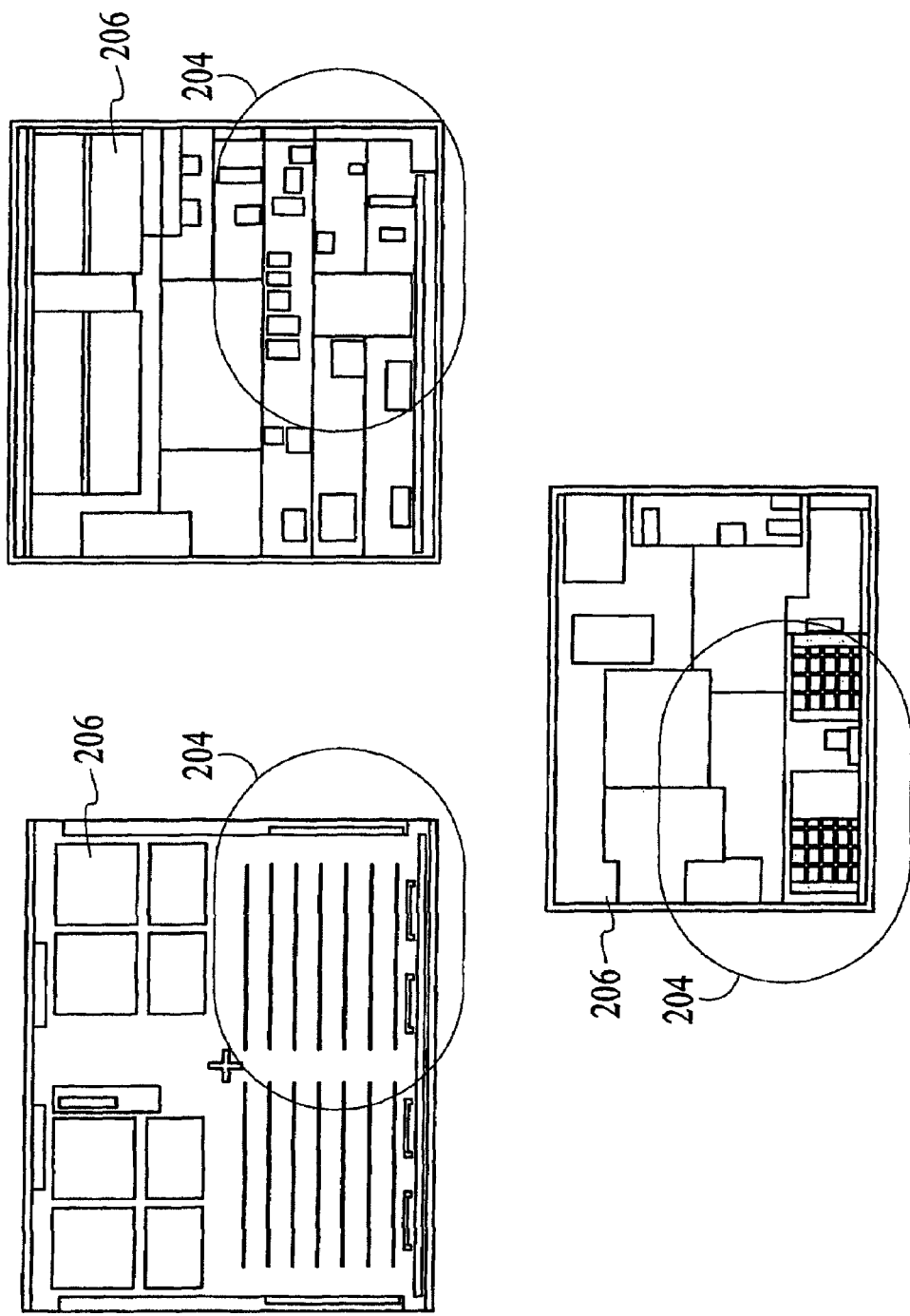
FIG. 2C is a view of the single die of FIG. 2B illustrating a first portion and a second portion of the die.

The dies 202 may be laid out in an orderly row-column fashion as shown in FIG. 2A. As illustrated in FIG. 2C, which shows three different exemplary types of dies, each individual die 202 may be square or rectangular in shape, and configured to have a number of portions, namely, a first portion 204 and a second portion 206. In some embodiments of the invention, only a first portion 204 of each region 202 is processed.

Additionally, as shown in FIG. 2C, each region 202 of the substrate and/or each portion 204 206 of each region 202 of the substrate 200 includes at least two structures or devices, more specifically, at least four structures or devices, and more specifically at least six structures or devices. In some embodiments, the plurality of structures in each region 202 or portion 204 206 of each region is the same in each region or portion of each region on the substrate 200. The structures or devices represent structures that may be constructed in various steps of the semiconductor manufacturing process. Each of the portions 204 206 may comprise one or more groups of structures that are laid out in a predetermined fashion according to their design. Additionally, the structures located in each region are preferably test and/or product device structures.

In some embodiments, a single substrate has at least 4 different processed regions and, more specifically, at least 10 different processed regions, more specifically, at least 50 different processed regions, and more specifically, at least 100 different processed regions. The density of regions per unit area will be greater than 0.01 regions/cm$^2$, more specifically greater than 0.05 regions/cm$^2$, even more specifically greater than 0.1 region/cm$^2$, and even more specifically greater than 0.5 regions/cm$^2$, and still more specifically greater than 1 regions/cm$^2$.

As previously explained, the substrate is preferably flat, but may take on a variety of alternative surface configurations. Regardless of the configuration of the substrate surface, it is desirable that the processing of each individual region, or portion thereof be prevented from affecting adjacent regions or portions thereof to be processed. Most simply, this can be ensured by leaving a sufficient amount of space between the regions on the substrate so that the various materials cannot interdiffuse between regions. Moreover, this can be ensured by isolating regions from one another by providing an appropriate barrier between the various regions on the substrate. A mechanical device or physical structure, which may or may not contact the substrate, can be used to define the various regions on the substrate. For example, a wall or other physical barrier, which, in some embodiments, can be removed after processing, can be used to prevent the material in the individual regions from moving to adjacent regions.

Methods for Delivery of Processing Materials

In some embodiments of the present invention, processing materials are delivered into each region. This may be accomplished using a variety of delivery techniques. Delivery techniques which are suitable for use in the methods of the present invention can include, for example, the use of thin-film deposition techniques and those involving the use of a dispenser Thin-film deposition techniques in combination with isolation or photolithographic techniques can be used to deposit thin-films on predefined regions on the substrate. Such thin-film deposition techniques can generally be broken down into the following four categories: evaporative methods, glow-discharge processes, gas-phase chemical processes, and liquid-phase chemical techniques. Included within these categories are, for example, sputtering techniques, spraying techniques, laser ablation techniques, electron beam or thermal evaporation techniques, ion implantation or doping techniques, chemical vapor deposition techniques, as well as other techniques used in the fabrication of integrated circuits. All of these techniques can be applied to deposit highly uniform layers, i.e., thin-films, of various materials on selected regions on the substrate. For an overview of the various thin-film deposition techniques which can be used in the methods of the present invention, see, for example, *Handbook of Thin-Film Deposition Processes and Techniques*, Noyes Publication (1988), which is incorporated herein by reference for all purposes.

Thin-films of various materials can be deposited on the substrate using evaporative methods, such as Molecular Beam Epitaxy in combination with physical masking techniques, such as those disclosed in U.S. Pat. No. 5,985,356, the disclosure of which is hereby incorporated by reference in its entirety for all purposes. Generally, in thermal evaporation or vacuum evaporation methods, the following sequential steps take place: (1) a vapor is generated by boiling or subliming a target material; (2) the vapor is transported from the source to the substrate; and (3) the vapor is condensed to a solid film on the substrate surface. Evaporants, i.e., target materials, which can be used in evaporative methods cover an extraordinary range of varying chemical reactivity and vapor pressures and, thus, a wide variety of sources can be used to vaporize the target material. Such sources include, for example, resistance-heated filaments, electron beams; crucible heated by conduction, radiation or rf-inductions; arcs, exploding wires and lasers. In some embodiments of the present invention, thin-film deposition using evaporative methods is carried out using lasers, filaments, electron beams or ion beams as the source. Successive rounds of deposition, through different physical masks, using evaporative methods generates an array of differentially processed regions on a substrate.

In addition to evaporative methods, thin-films of various materials can be deposited on the substrate using glow-discharge processes and systems, such as sputtering, or sputter deposition processes, including RF/DC Glow Discharge Plasma Sputtering, Ion-Beam Sputtering, diode sputtering, and reactive sputtering in combination with physical masking techniques. Successive rounds of deposition, through different physical masks, using sputtering or other glow-discharge techniques and systems, such as those disclosed in U.S. Pat. No. 5,985,356 generate an array of differentially processed regions on a substrate.

In addition to evaporative methods and sputtering techniques, thin-films of the various reactants can be deposited on the substrate using Chemical Vapor Deposition techniques in combination with physical masking techniques and systems as disclosed in U.S. Pat. No. 5,985,356.

In addition to evaporative methods, sputtering and Chemical Vapor Deposition, thin-films of the various reactants can be deposited on the substrate using a number of different mechanical techniques in combination with physical masking or isolation techniques. Such mechanical techniques include, for example, spraying, spinning, dipping, and draining, flow coating, roller coating, pressure-curtain coating, brushing, etc. Sprayers which can be used to deposit thin-films include, for example, ultrasonic nozzle sprayers, air atomizing nozzle sprayers and atomizing nozzle sprayers. In ultrasonic sprayers, disc-shaped ceramic piezoelectric transducers covert electrical energy into mechanical energy. The transducers receive electrical input in the form of a high-frequency signal from a power supply that acts as a combination oscillator/amplifier. In air atomizing sprayers, the nozzles intermix air and liquid streams to produce a completely atomized spray. In atomizing sprayers, the nozzles use the energy of a pressurized liquid to atomize the liquid and, in turn, produce a spray. Deposition through different physical masking and isolation techniques, using mechanical techniques such as spraying generates an array of differentially processed regions on the substrate.

In addition to the thin film-techniques described above, dispensers can be utilized to deliver processing materials in the form of droplets or powder to a single substrate.

In some embodiments, the present invention may employ dispensers commonly utilized in the ink-jet printing field. Such ink-jet dispensers include, for example, the pulse pressure type, the bubble jet type and the slit jet type.

Such inkjet printers can be used with minor modification by simply substituting a solution or powder for the ink. For example, Wong, et al., European Patent Application 260 965, incorporated herein by reference for all purposes, describes the use of a pulse pressure type ink-jet printer to apply an antibody to a solid matrix.

One embodiment of an ink drop dispenser of the pulse pressure type which may be employed in the present invention is described in U.S. Pat. No. 5,985,356. It will be readily apparent to those of skill in the art that ink-jet printers of the bubble jet type and the slit jet type can also be used, with only minor modifications, to deliver materials to predefined regions on the substrate. Moreover, it will be readily apparent to those of skill in the art that inkjet printers having multiple nozzles can be used to deliver multiple materials to predefined regions on the substrate. In addition, as improvements are made in field of inkjet printers, such improvements can be used in the methods of the present invention.

Using the aforementioned techniques, the processing materials can be delivered to predefined regions on the substrate either sequentially or simultaneously. In one embodiment, the processing materials are simultaneously delivered to either a single predefined region on the substrate or, alternatively, to multiple predefined regions on the substrate. For example, using a dispenser such as an inkjet dispenser having two nozzles, two different processing materials can be simultaneously delivered to a single predefined region on the substrate. Alternatively, using this same ink-jet dispenser, a processing material can be simultaneously delivered to two different predefined regions on the substrate. In this instance, the same processing material or, alternatively, two different processing materials can be delivered. If the same processing material is delivered to both of the predefined regions, it can be delivered at either the same or different concentrations. Similarly, using a dispenser such as an ink-jet dispenser having eight nozzles, for example, eight different processing materials can be simultaneously delivered to a single predefined region on the substrate or, alternatively, eight processing materials (either the same or different) can be simultaneously delivered to eight different predefined regions on the substrate.

It will be readily apparent to those of skill in the art that the foregoing delivery techniques are intended to illustrate, and not restrict, the ways in which the processing materials can be delivered to the substrate. Other delivery techniques, such as stamping, rolling, or otherwise imprinting known to and used by those of skill in the art can also be used.

Processing Tool

Processing systems of the invention include a processing tool adapted to process each region of the substrate individually. In one embodiment of the present invention, the processing tool is adapted for the delivery of processing materials to the regions of the substrate, and is carried out using a partially or fully automated solution delivery system including a processing cell and its associated solution delivery system, robotics and electronics.

Figure 3A:
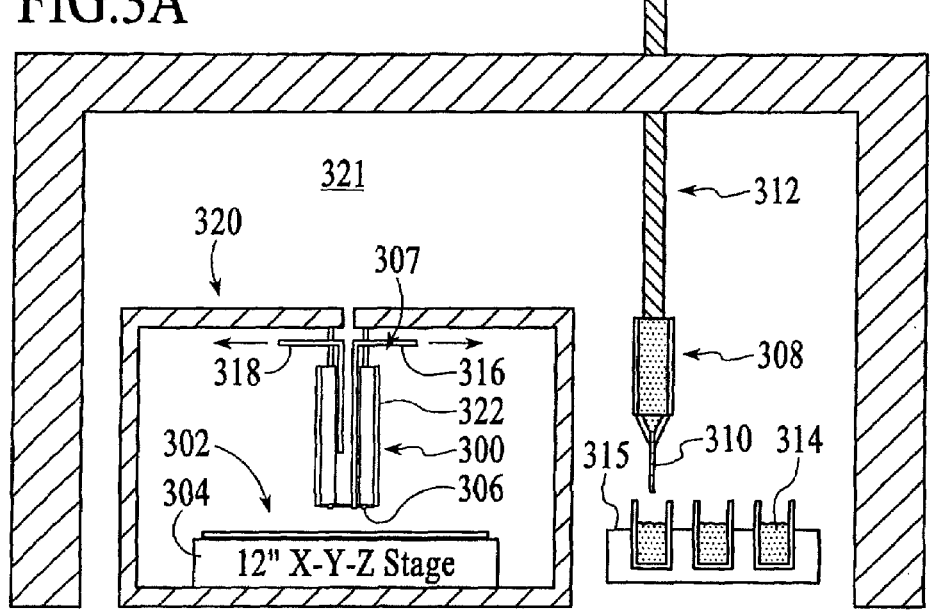
FIG. 3A illustrates an embodiment of a system of the present invention for serial combinatorial process sequence integration of wet processes, such as those used in IC and related manufacturing.

FIG. 3A illustrates an embodiment of a system of the present invention for combinatorial process sequence integration of wet processes, such as those used in IC and related manufacturing, in which a processing cell for carrying out a processing step or process sequence can be discretely stepped across desired locations of a substrate, such as a wafer, preferably per die location by translating the substrate. The cell is made so as to fully encompass each region, e.g., die, or a first portion of each die, but not interfere with neighboring regions, e.g., dies or portions of dies.

FIG. 3A shows one embodiment of a processing system for processing regions of a substrate. In the system, a processing cell 300 corresponds to a first region, such as an individual die location on a single monolithic substrate 302, such as a 300 mm wafer. The processing cell 300, which is held by a frame 301 (shown in FIG. 3B) and optionally hangs from a spring 307, can be used to process a unique region on the substrate 302 in a unique fashion compared to other regions on the substrate 302. The processing cell 300 can also be used to perform a unique sequence of unit processes. In one embodiment, the substrate 302 is located on a stage 304, such as an X-Y-Z translatable stage, which can hold the substrate 302. Positioning and alignment techniques can be used to align and position the substrate 302, such that the processing cell 300 is aligned and brought into contact with a corresponding region, such as a die on the substrate 302. This can be achieved using alignment pins in conjunction with stepper motors, or optical alignment, and/or other commonly known techniques to move the substrate 302 with respect to the processing cell 300. A sealing element 306 such as an elastomeric seal, e.g., o-ring, can be used to form a seal between the processing cell 300 and the substrate 302 when the two elements are brought into contact, to isolate the region of the substrate from other regions of the substrate. The elastomeric seal may be constructed of a material such as Kalrez, Viton or Chemrez, which is chosen to be chemically inert and/or stable with respect to the processing environment. The seal is designed such that when in contact with the substrate, the region to be processed will be isolated from other regions to be processed. In this particular example, the stage 304 is motorized so as to be able to move the substrate 302 in an X-Y direction to align a region of interest with the processing cell 300 and vertically until such sealing can be achieved. Dispensing, placing, processing, etc. within the processing cell 300 can be achieved in a serial fashion with a delivery system 308 which delivers processing fluids 314 through the processing cell 300. The processing cell 300 optionally includes a vacuum line 316 for removing residual processing fluids and rinse solvents from the region of the substrate 302 subsequent to processing, a rinse line 318, in fluid communication with a rinse solvent source (not shown) for rinsing the processed region of the substrate 302, and/or a gas purge line 317 (shown in FIG. 4B) in fluid communication with a purge gas source (such as argon or nitrogen, not shown) for introducing a gas to the region of the substrate 302 before, during, and/or after processing. The gas purge line 317 can be designed to introduce gas into the processing cell through the processing fluid (by having a length such that an outlet of the line is immersed in the processing fluid) or to introduce the gas to the atmosphere of the processing cell (by having a length such that an outlet of the line is not in the processing fluid). The vacuum line 316 and rinse line 318 are designed to remove and deliver fluids through the processing cell 300 to the isolated region of the substrate. In order to maintain a clean room-type environment, the processing cell 300 and substrate 302 are preferably located in a mini-environment 320 which may be optionally sealed and/or purged. In some embodiments, the mini-environment 320 is purged with a purge gas such as argon or nitrogen. In another embodiment, it is desirable to control the level of oxygen in the mini-environment to prevent oxidation of the substrate and/or reagents used during the processing of the substrate, and the like. Nitrogen, argon, helium, forming gas, and other suitable purge gases can be used to maintain low oxygen concentrations within the mini-environment 320. The environment 321 outside of the mini-environment 320 can be similarly controlled.

The processing cell 300 can also have a heating element 322 embedded either in the wall of the cell 300 (not shown) or around the outside of the cell 300, in order to enable heating of the processing fluids and/or the substrate 302. In another embodiment, the stage 304 can be heated to heat the substrate 302.

An agitation mechanism 319 (shown in FIG. 4B) can also be present in the processing cell 300 to facilitate reactions. For example, a physical stir rod, a magnetically based agitation, a gas based agitation, a vibration based agitation (e.g., sonication), and the like can be used to locally agitate the processing region of interest. In addition, the substrate can be globally agitated via the stage 304 in a rotational, vibrational, and the like fashion(s).

Figure 3B:
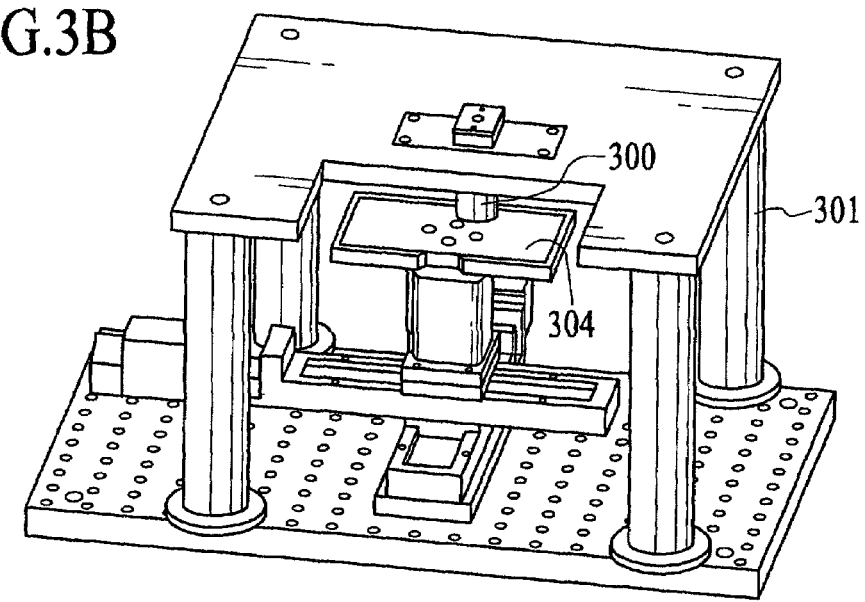
FIG. 3B shows a perspective view of the processing tool described in FIG. 3A.

FIG. 3B shows a perspective view of the processing tool described in FIG. 3A without the substrate 302 or delivery system 308.

Figure 4B:
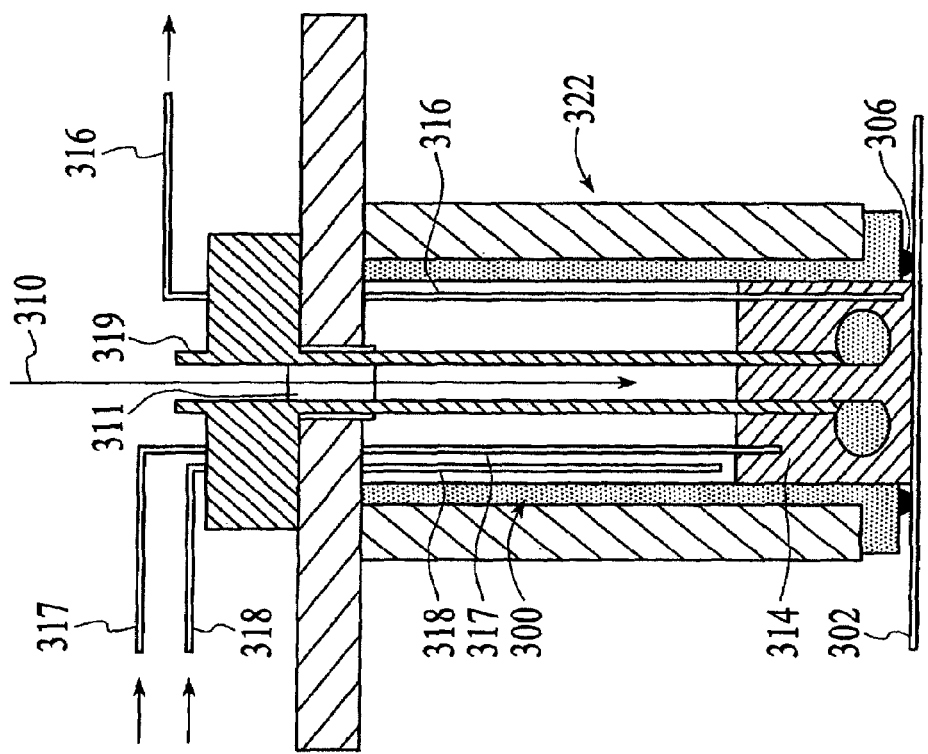
FIG. 4B is a view of the processing cell in contact with the substrate after processing fluid has been delivered to the isolated region of the substrate.
Figure 4A:
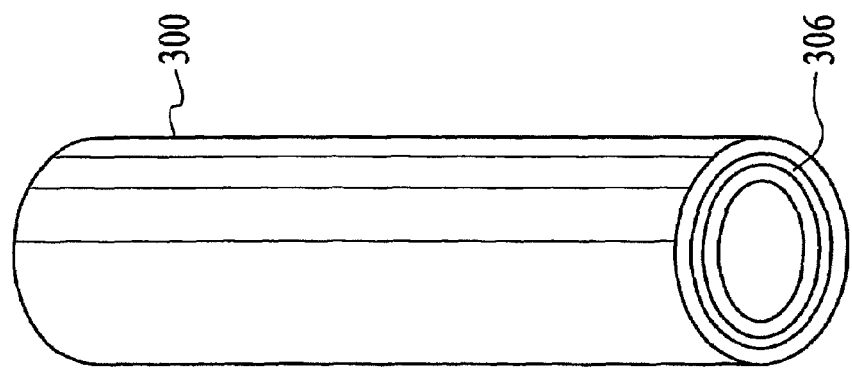
FIG. 4A is a perspective view of an embodiment of a processing cell as used in a processing tool of the present invention.

In one embodiment, the processing cell 300, as shown in FIG. 4A, can have a tubular configuration having an inner diameter consummate with the size of the region or portion of the region of the substrate 302 that is to be isolated. In one embodiment, the inner diameter of the processing cell 300 is between 5-50 mm, more specifically between 10-30 mm, and more specifically between 10-20 mm. One of skill in the art will recognize that the shape is not critical, and that a variety of configurations are within the scope of the invention. The material used for the fabrication of the processing cell 300 is preferably chosen to be chemically inert and stable with respect to process chemistries and environments, such as Teflon or quartz. The processing cell can also optionally include an insert (not shown). The insert can be designed to be disposable and optionally can be adapted to be used for specific types of processing.

As shown in FIG. 4B, when the processing cell 300 is in contact with the substrate 302, processing fluids 314 are delivered to the isolated region of the substrate 302 through a probe 310 of the delivery system. In one embodiment, the processing cell is sealed on its upper surface, such as with a septum 311. When delivering processing fluids to the processing cell 300, the probe 310 pierces the septum 311. The sealing element 306 prevents the processing fluids 314 from leaving the isolated region. In one embodiment, the processing system is designed for the processing cell 300 to hold between 10 µL and 10,000 µL, more specifically between 100 µL and 5,000 µL, and more specifically between 500 µL and 2,000 µL.

Figure 5:
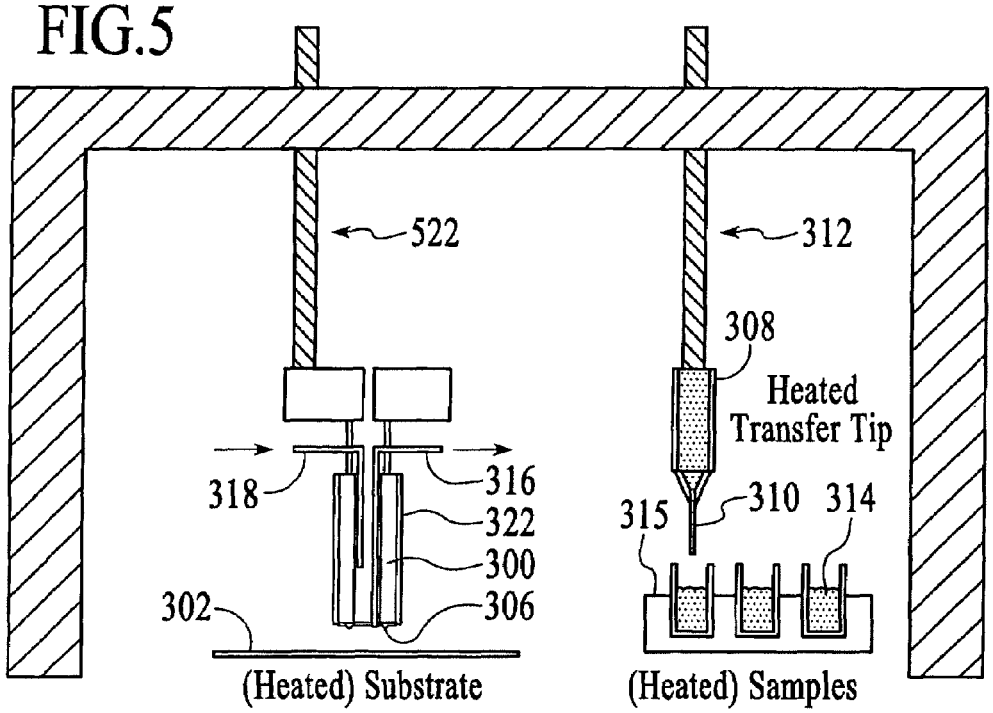
FIG. 5 illustrates an embodiment of a system of the present invention for serial combinatorial process sequence integration of wet processes, such as those used in IC and related manufacturing in which the processing cell moves from region to region of the substrate.

In another embodiment, as shown in FIG. 5, the substrate 302 is not located on a translation stage, and instead, the processing cell 300 includes a support arm 522, a translation station (not shown) for providing three-dimensional motion of the processing cell 300, and a microprocessor (not shown), such as a computer, for controlling three-dimensional motion of the processing cell 300 between various spatial addresses. In one embodiment, the support arm 522 is preferably an XYZ robotic arm, such as can be commercially obtained from Cavro Scientific Instruments, Inc. (Sunnyvale, Calif.) among others. In this embodiment, the processing cell 300 is translated from region to region of the substrate 302.

The delivery system 308, as shown in FIGS. 3A, 5, 7C and 7E, such as an auto-delivery system and delivery methods, such as auto-delivering methods can be used to deliver processing materials, such as processing fluids to the isolated regions of the substrate 302 for processing the region. In one embodiment, an auto-delivering system 308 can include a movable probe (tip) 310, typically mounted on a support arm 312, a translation station (not shown) for providing three-dimensional motion of the probe 310, and a microprocessor (not shown), such as a computer, for controlling three-dimensional motion of the probe 310 between various spatial addresses. The auto-delivery system 308 preferably also comprises a user-interface (not shown) to allow for user programming of the microprocessor with respect to probe motion and manipulations. The probe 310 can have an interior surface defining a cavity and an inlet port for fluid communication between the cavity and a processing fluid source 314. In one embodiment, the probe is heated using a resistive temperature-control element or a fluid heat-exchanger type temperature-control element such as those disclosed in U.S. Pat. No. 6,260,407, the disclosure of which is hereby incorporated by reference in its entirety. The probe 310 is also adapted for fluid communication with the processing cell 300. The support arm 312 is preferably an XYZ robotic arm, such as can be commercially obtained from Cavro Scientific Instruments, Inc. (Sunnyvale, Calif.) among others. To improve smoothness of operation at high speeds, such XYZ robotic arms preferably have motions based on gradient variations rather than step-function variations, and preferably are belt-driven rather than shaft driven. The auto-delivery system 308 can further include one or more pumps (not shown), preferably syringe pumps, for drawing and/or expelling fluids, such as liquids, and related connection lines (not shown) for fluid communication between the pumps, the probe 310, and liquid (e.g. solvent) reservoirs 315. Pump configurations, such as peristaltic pumps, vacuum-pumps or other motive-force providing means can be used additionally or alternatively.

In operation, the microprocessor of the auto-delivery system 308 can be programmed to direct the auto-delivery system 308 to withdraw a processing fluid 314 (e.g., a reactant) from a fluid container 315 (e.g., a sample well) formed in a sample tray into the delivery probe 310, and subsequently to direct the probe 310 to the processing cell 300 for delivering the fluid to the isolated region of the substrate 302 through the processing cell 300. The microprocessor of the auto-delivery system includes a user-interface that can be programmed in order to variate the processing conditions among the plurality of regions of the substrate 302.

In some embodiments, after delivery of processing material(s) to a first region of a substrate, a residual portion of the fluid still remaining in the cavity of the auto-delivery probe 310, if any, can be expelled, for example to a waste container. Additionally or alternatively, the auto-delivery probe can be cleaned during this interval. Cleaning the auto-delivery probe, in an automated fashion, can include flushing the cavity of the probe 310 with a solvent source available to the probe, and then expelling the solvent into a waste container. Such withdrawal and expelling of a cleaning solvent can be repeated one or more times, as necessary to effectively limit the extent of cross-contamination between processing a first and a second region to a level that is acceptable. As an alternative or additional cleaning protocol, the probe may be immersed in a cleaning solution and moved around therein to effectively rinse residual material from both the external portion of the probe and the cavity thereof. The expelling step and the one or more cleaning steps can be, and are preferably automated. While expelling and cleaning steps are generally preferred, no cleaning may be required for processing applications in which minor sample cross-contamination is acceptable.

Figure 6A:
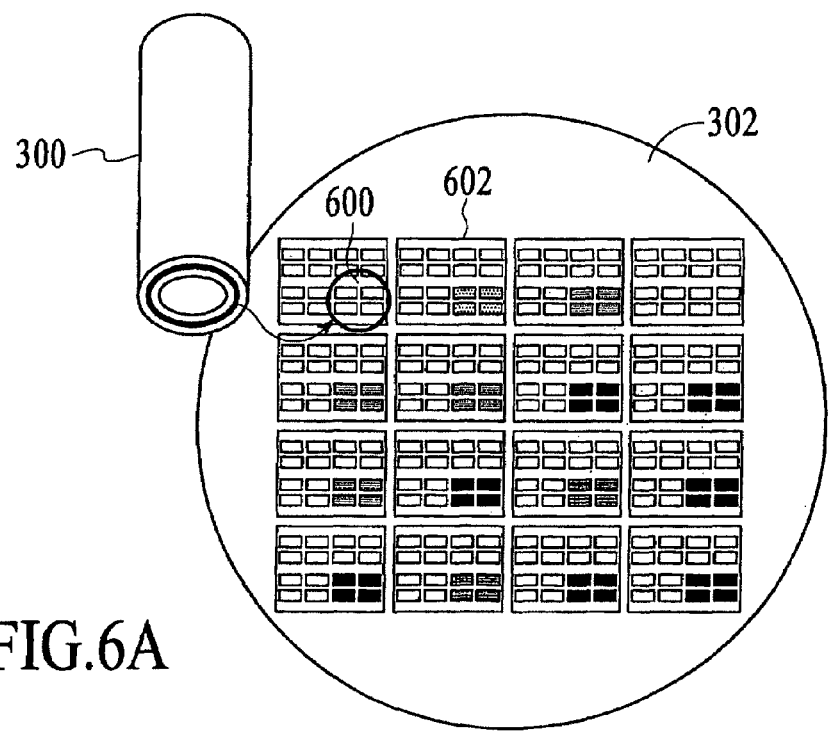
FIG. 6A is a view of an illustration of a first region of a substrate being individually processed by the system of the present invention.
Figure 6B:
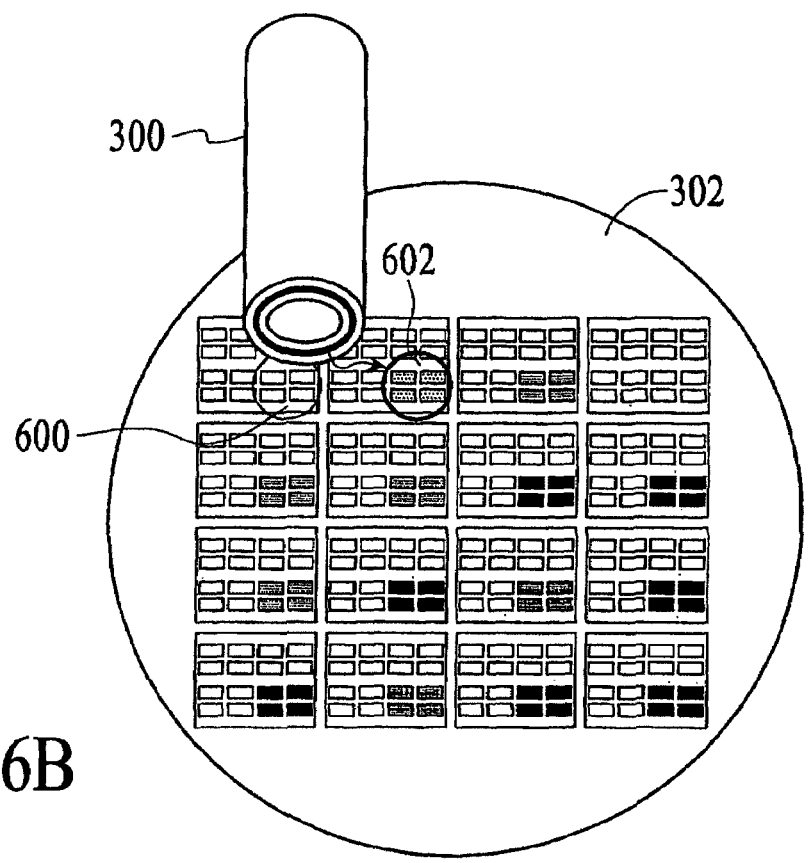
FIG. 6B is a view of an illustration of the substrate and processing system of FIG. 6A, where a second region has been processed after the first region.
Figure 6C:
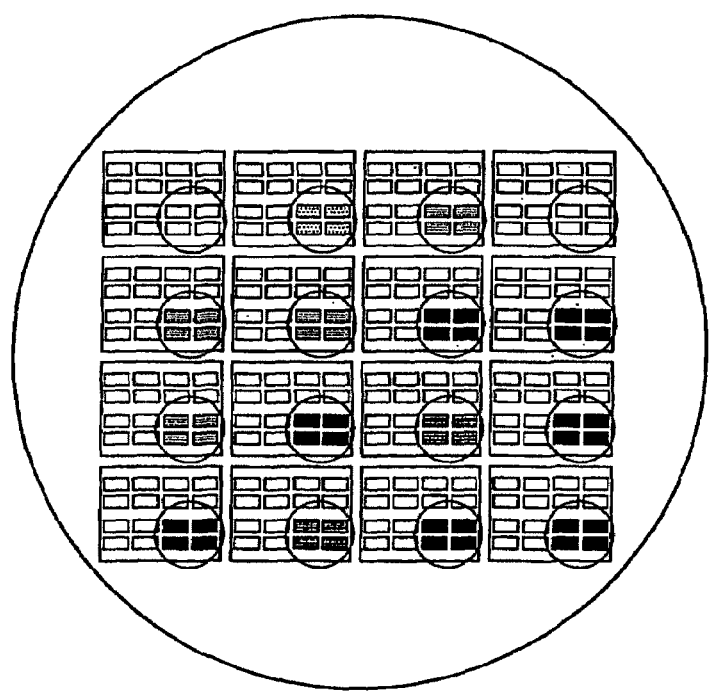
FIG. 6C is a view of an illustration of the substrate and processing system of FIGS. 6A and 6B, where all of the regions of the substrate have been individually processed.

Referring to FIGS. 6A-C, the operation of the automated processing system is described as follows. After bringing the processing cell 300 into contact with the substrate 302 to isolate a region or a portion of a region 600 of the substrate 302 from other regions of the substrate 602, the delivery system is positioned above the processing cell 300, and the pumps are activated causing the processing fluids located in the cavity of the probe 310 to flow through the processing cell 300 and collect in a region 600 of the substrate 302 isolated by the processing cell 300 under processing conditions. After processing, residual fluids located in the processing cell 300 are removed via the vacuum line 316, the region is optionally rinsed via the rinse line 318, and the delivery system 308 is optionally rinsed and moved to the next region 602 (as shown in FIG. 6B) where the next specified processing occurs. In one embodiment of the present invention, a plurality of process fluids are delivered and/or a plurality of process sequences are carried out in the first region 600 prior to the processing cell 300 moving to the next region 602. In one embodiment, a purge gas is used in conjunction with and/or after rinsing. For example, a cleaning or rinsing fluid, such as isopropyl alcohol can be used in conjunction with nitrogen purge gas to effect a cleaning and/or rinse/dry sequence (e.g., to eliminate or control watermark formation) either in between or after the delivery of certain process fluids to a region. The purge gas distribution tube 317 can be added to the processing cell so as to effect localized distribution of the purge gas to the region of interest. In one embodiment, all regions, or a portion of all regions of the substrate are individually processed such that the regions are processed differently from each other, as shown in FIG. 6C.

Figure 7B:
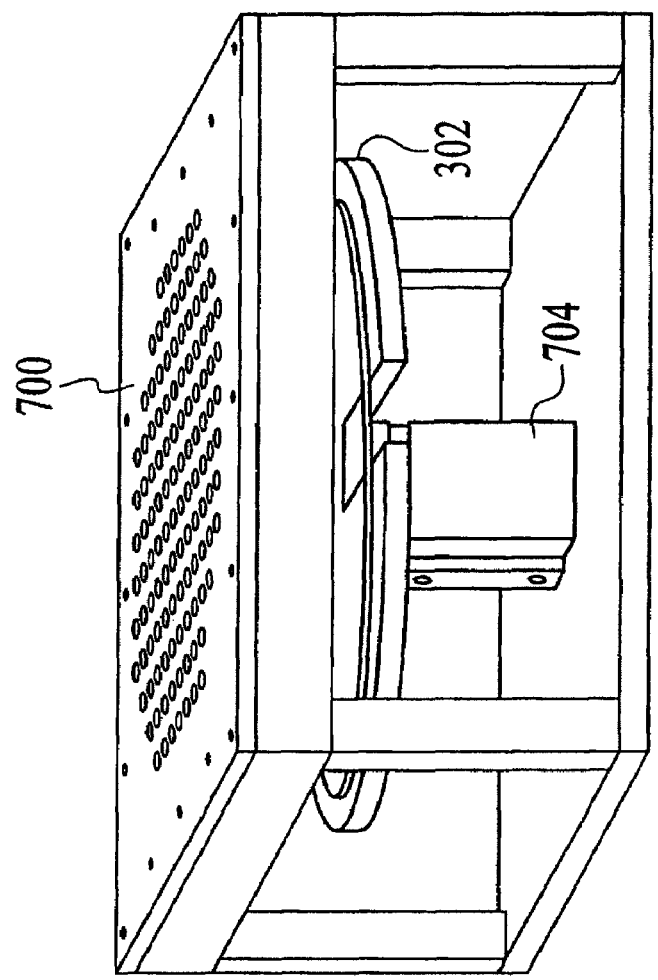
FIG. 7B is a perspective view of a parallel processing tool incorporating the chamber array described in FIG. 7A.
Figure 7A:
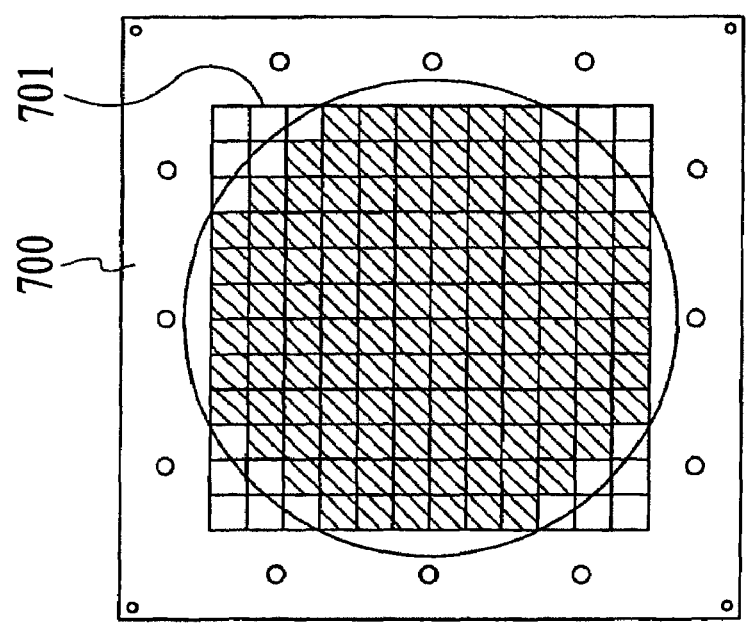
FIG. 7A is a bottom view of a parallel isolation chamber or unitary structure of an array of processing cells for use in the processing system of an embodiment of the present invention.

FIGS. 7A, 7B, 7C, 7D and 7E illustrate some embodiments of the present invention for processing regions in parallel, such as combinatorial process sequence integration of wet processes used in IC and related manufacturing. FIG. 7A shows a bottom view of collection of processing cells in a unitary structure 700, preferably corresponding to the individual die locations or portions of individual die locations within a single monolithic substrate, such as a 300 mm wafer. The cross-section shape of the cells is not critical. For example, as shown in FIG. 7A, the processing cells can have a square design. In other embodiments the processing cells of the structure 700 can have a circular cross-section.

Figure 8:
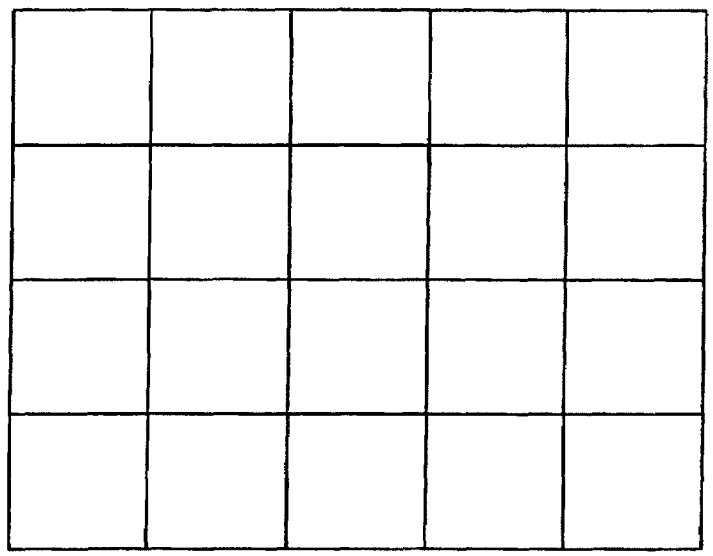
FIG. 8 shows a top view of one embodiment for a sealing element for use in one embodiment of the parallel processing tool.

In some embodiments, the structure 700 is designed to receive a sealing element for creating a seal between the structure 700 and the substrate during processing. In one embodiment, the structure 700 includes a groove 701 for receiving a single seal 706, such as that shown in FIG. 8, that is adapted to provide a sealing element around each processing cell of the structure 700. In another embodiment, the structure can utilize several seals for groups or individual cells of the structure.

As discussed above for the embodiments utilizing single processing cells, the structure 700 can also include inserts for each processing cell. The inserts can be designed to be disposable and optionally can be adapted to be used for specific types of processing. In this manner, different processes can be conducted on different regions by using different inserts in different cells of the structure.

Figure 9A:
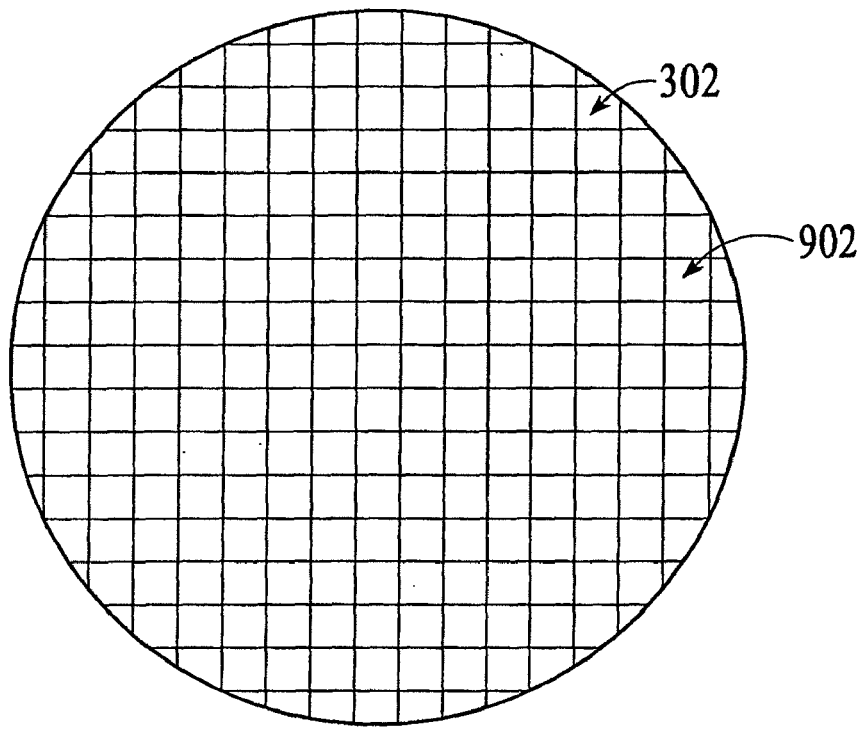
FIG. 9A is a top view of one embodiment of the substrate illustrating regions of a substrate that can be processed with the structure shown in FIG. 7A.

Each cell of the structure 700 can be used to process a unique region 902 on the substrate 302 in a unique fashion as shown in FIG. 9A. Each unique site isolated cell can also be used to perform a unique sequence of unit processes. FIG. 7B shows an embodiment of the multiprocessing cell array 700 mated to a stage 704 which can hold the monolithic substrate 702. Positioning and alignment techniques can be used to align and position the cell array 700 such that the array is aligned to each corresponding die on the substrate 302. This can be achieved using alignment pins in conjunction with stepper motors, or optical alignment, and/or other commonly known techniques to move the substrate with respect to the multi-processing cell array.

A sealing element 706 such as individual elastomeric seals, e.g. o-rings, corresponding to each unique cell, or a preformed monolithic elastomeric seal can be used to form a seal when the processing cell array 700 is brought into contact with the substrate 302. The elastomeric seal 706 is preferably constructed of a material such as Kalrez, Viton or Chemrez, which is chosen to be chemically inert and/or stable with respect to the processing environment. The sealing element 706 is made to fit into the multiprocessing array 700 (such as in the groove 701) and is designed such that when in contact with the substrate 302, each discrete region of the substrate 302 will be isolated from other regions or portions thereof. In this particular example, the stage is motorized so as to be able to move the substrate 302 vertically until such sealing can be achieved. Dispensing, placing, processing, etc. within each cell can be achieved using a serial dispenser 308 such as that described above for the embodiment of FIG. 3A or in a parallel fashion with a plurality of such dispensers 708 as shown in FIG. 7D.

In one embodiment, a parallel dispense is preferable when the relative timing between the processing of the individual regions become important. In one embodiment, this is accomplished with a plurality of dispensers 708 as shown in FIG. 7D. In another embodiment, this is accomplished by providing a plurality of dispensing cells 716. The dispensing cells 716 can be separate units or part of a single structure, such as a block. The dispensing cells 716 are located above the processing cells 700 and provide a location for processing fluids to be delivered and/or mixed prior and/or otherwise treated prior to delivery to the processing cells 700. In some embodiments, processing fluids are delivered to the dispensing cells 716 until every dispensing cell contains the fluids to be delivered. A valve array 718 can then be opened so that processing fluids are delivered simultaneously to all regions to be processed. Heating elements (not shown) can optionally be embedded in the walls of the dispensing cells 716, or the processing cell to enable global heating of the processing fluids 314 and/or the substrate. The substrate itself can also be heated either directly (such as in an oven or from other external heat sources, such as a laser or UV lamp) or via a heated stage (such as through the use of a resistive and or other suitable heating mechanism). The material used for the fabrication of the multiprocessing cell array is preferably chosen to be chemically inert and stable with respect to process chemistries and environments.

Figure 7C:
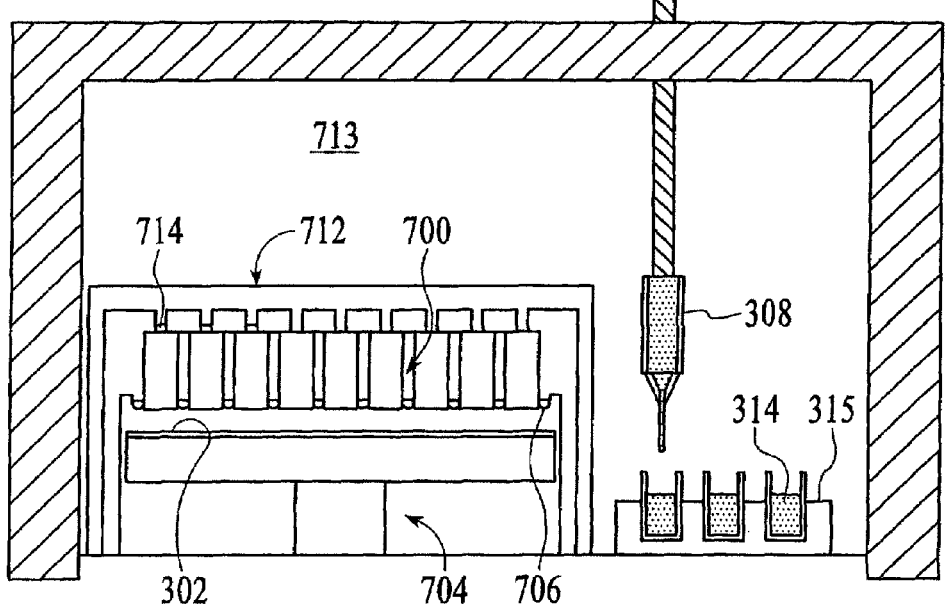
FIG. 7C illustrates an embodiment of a system of the present invention for parallel combinatorial process sequence integration of wet processes, such as those used in IC and related manufacturing.
Figure 7D:
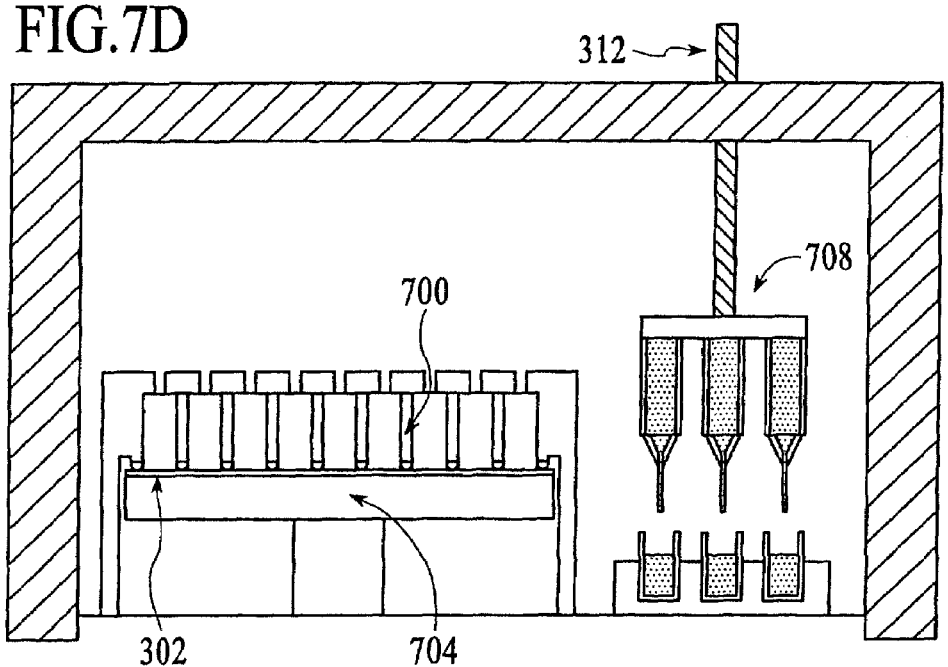
FIG. 7D illustrates an embodiment of a system of the present invention for parallel combinatorial process sequence integration of wet processes, utilizing an embodiment of a parallel dispensing device.
Figure 7E:
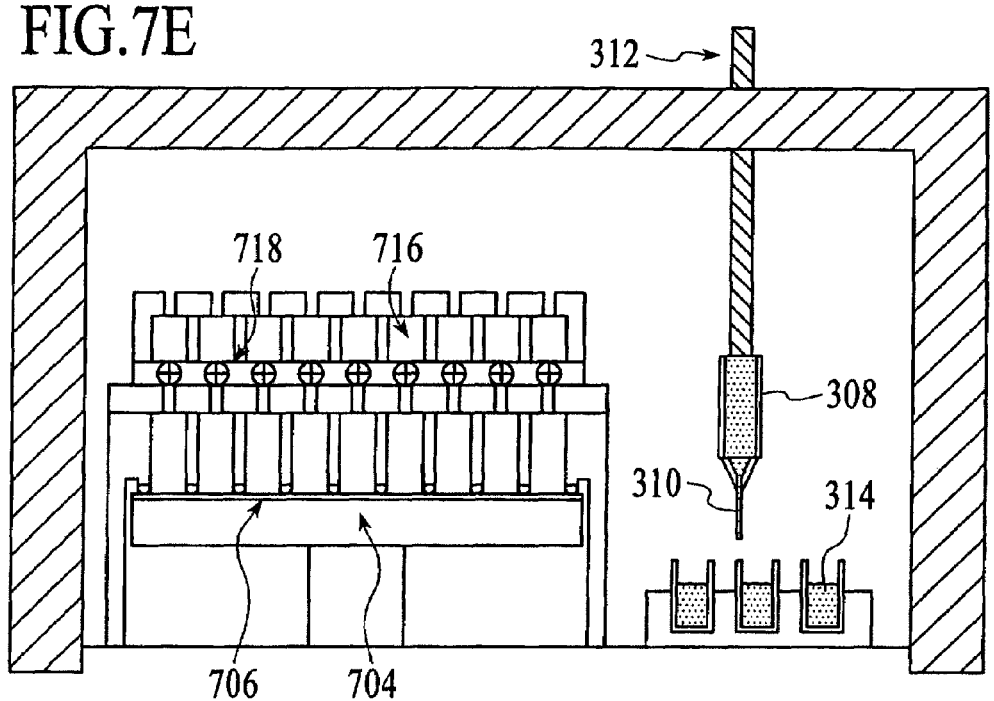
FIG. 7E illustrates another embodiment of a system of the present invention for parallel combinatorial process sequence integration of wet processes, utilizing an embodiment of a parallel dispensing device.

The embodiment of FIGS. 7C, 7D and 7E can also optionally include vacuum and rinse lines (not shown) as described in the embodiment of FIG. 3A or the embodiment of FIG. 4B for removing residual processing fluids and rinse solvents and delivering rinse solvents to the processed regions. In one embodiment, a vacuum and rinse line is located in each processing cell of the structure 700. In another embodiment, a vacuum line and rinse line are translated from cell to cell during processing such as by a Cavro robot. The processing cell can also optionally include an agitation mechanism for use in facilitating reactions. For example, a physical stir rod, a magnetically based agitation, a gas-based agitation, a vibration-based agitation, and the like can be used to locally agitate the processing region of interest. In addition, the substrate can be globally agitated via the stage in a rotational, vibrational, and the like fashion(s). The processing system of FIGS. 7C, 7D and 7E can also be contained in a mini-environment 712, such as a sealed environmental chamber. In other embodiments, each individual processing cell can be sealed from the outside environment 713 through the use of sealing elements, such as a septum 714 located as either separate elements or as a single unitary structure. The individual processing cells can also be independently or individually purged with a purge gas such as argon or nitrogen. In some embodiments, the mini-environment 712 is purged with a purge gas such as argon or nitrogen. In another embodiment, it is desirable to control the level of oxygen in the mini-environment to prevent oxidation of the substrate and/or reagents used during the processing of the substrate, and the like. Nitrogen, argon, helium, forming gas, and other suitable purge gases can be used to maintain low oxygen concentrations within the mini-environment 712. The environment 713 outside of the mini-environment 712 can be similarly controlled. In yet another embodiment, it is desirable to control the level of oxygen in the environment to prevent oxidation of the substrate and/or reagents used during the processing of the substrate, and the like. Nitrogen, argon, helium, forming gas, and other suitable purge gases can be used to maintain low oxygen concentrations within the mini-environment 712. The outside environment 713 can be similarly controlled. The pressure within the mini-environment 712 and/or the outside environment 713 can be also adjusted to be below, at, or above atmospheric pressure.

Figure 9B:
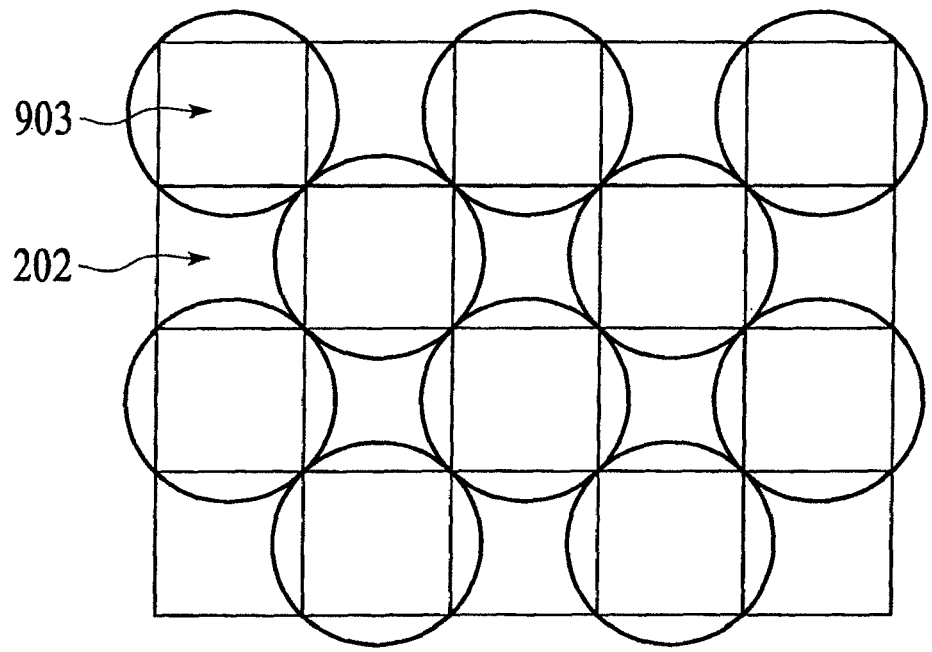
FIG. 9B illustrates another embodiment of a configuration for processing cells for the parallel processing of regions of a substrate.
Figure 9C:
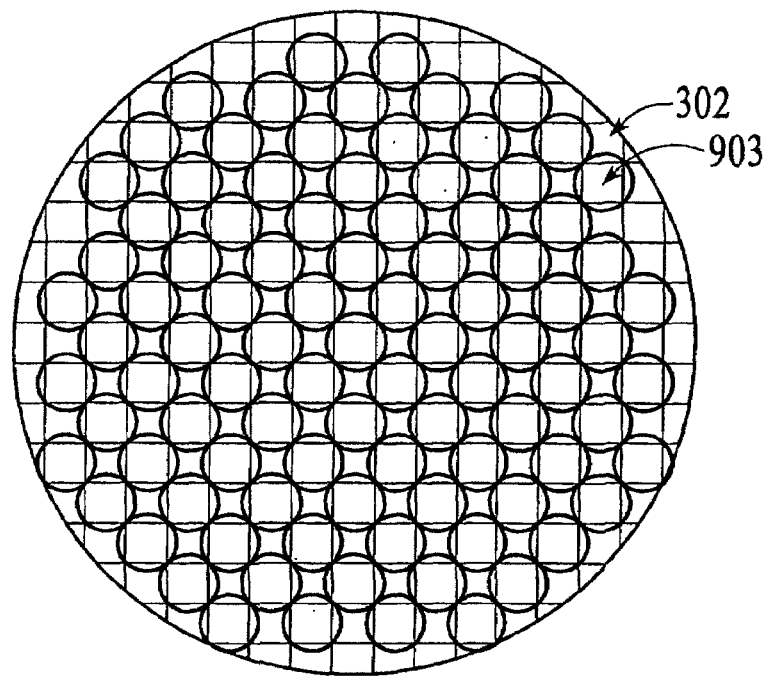
FIG. 9C is a top view of one embodiment of the substrate illustrating regions of a substrate that can be processed according to the configuration of FIG. 9B.
Figure 9D:
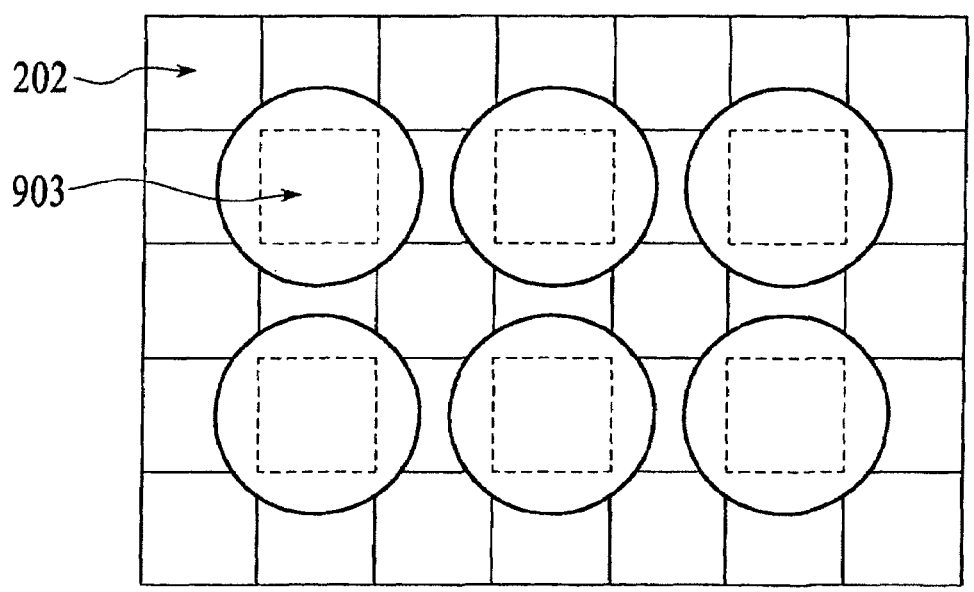
FIG. 9D illustrates another embodiment of a configuration for processing cells for the parallel processing of regions of a substrate.
Figure 9E:
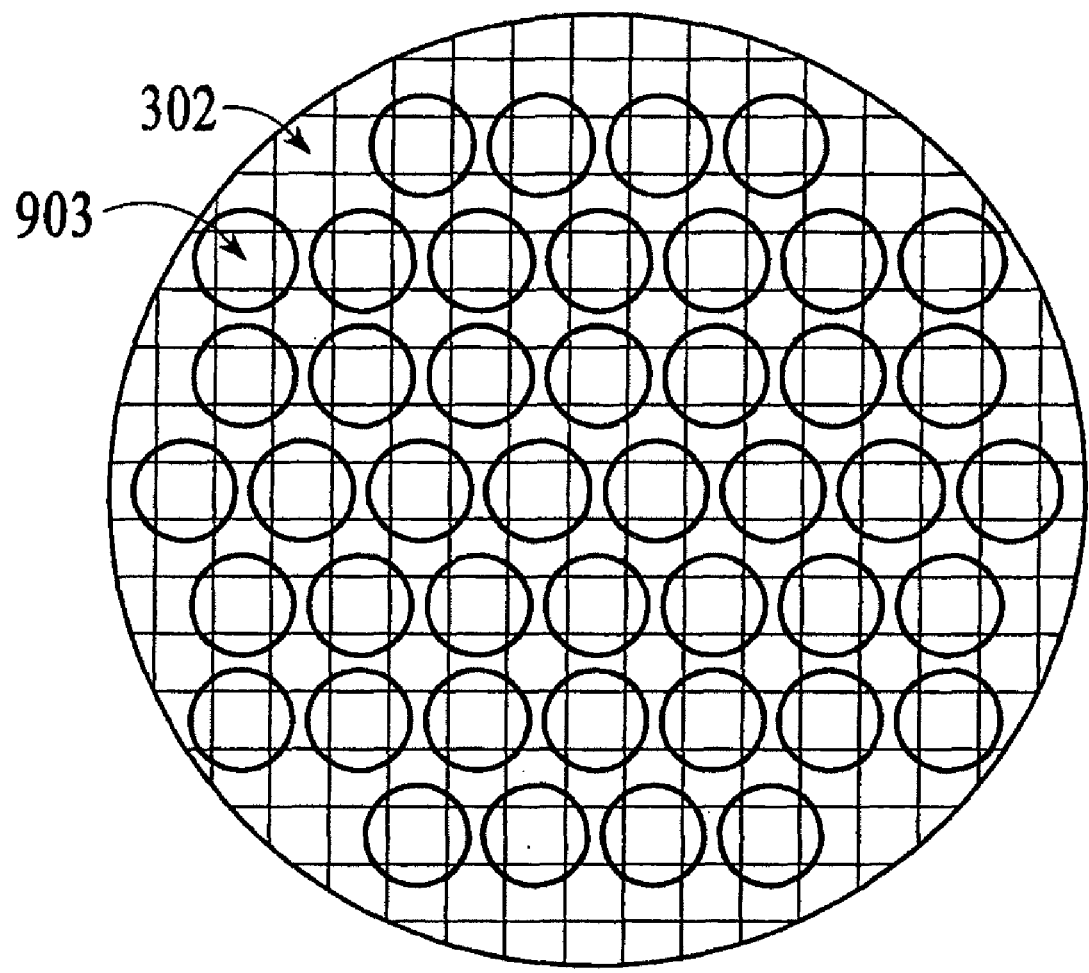
FIG. 9E is a top view of one embodiment of the substrate illustrating regions of a substrate that can be processed according to the configuration of FIG. 9D.

One of skill in the art will recognize that several variations of the embodiments described above are within the scope of the invention. For example embodiments in which a plurality of individual, separate processing cells are used to process a plurality of regions or portions of regions of a substrate are within the scope of the invention. Additionally, embodiments in which a single, unitary structure which includes a plurality of processing cells that corresponds to a plurality of regions of the substrate, but not all of the regions, such that a first plurality of regions are processed, the processing cell structure and the substrate are realigned, and a second plurality of regions is processed are also within the scope of the invention. Furthermore, in other embodiments, such as those shown in FIGS. 9B and 9D, the processing cells have a circular shape, and can be configured such that an entire region 202 is covered by the processing cells, but not all of the regions are processed. In FIG. 9B, the parallel processing structure, which may be a plurality of separate cells, or a plurality of cells in a single structure, is configured such that every other region 903 is processed with the edge of the processing cells contacting only the corners of the regions to be processed. FIG. 9C illustrates the substrate 302 with every other region 903 processed with the configuration of FIG. 9B. In FIG. 9D, the parallel processing structure is configured such that only certain regions 903 are processed with the edge of the processing cells contacting no portion of the regions to be processed. FIG. 9E illustrates the substrate 302 with certain regions 903 processed with the configuration of FIG. 9D.

In addition to the foregoing isolation techniques, photolithographic techniques of the type known in the semiconductor industry can be used to isolate regions of a substrate. For an overview of such techniques, see, for example, Sze, *VLSI Technology*, McGraw-Hill (1983) and Mead, et al., *Introduction to VLSI Systems*, Addison-Wesley (1980), which are incorporated herein by reference for all purposes. A number of different photolithographic techniques known to those of skill in the art can be used. In one embodiment, for example, a photoresist is deposited on the substrate surface; the photoresist is selectively exposed, i.e., photolyzed; the photolyzed or exposed photoresist is removed; a processing material is deposited on the exposed regions on the substrate; and the remaining unphotolyzed photoresist is removed.

Alternatively, when a negative photoresist is used, the photoresist is deposited on the substrate surface; the photoresist is selectively exposed, i.e., photolyzed; the unphotolyzed photoresist is removed; a processing material is deposited on the exposed regions on the substrate; and the remaining photoresist is removed. In another embodiment, a processing material is deposited on the substrate using, for example, spin-on or spin-coating techniques; a photoresist is deposited on top of the processing material; the photoresist is selectively exposed, i.e., photolyzed; the photoresist is removed from the exposed regions; the exposed regions are etched to remove the processing material from those regions; and the remaining unphotolyzed photoresist is removed. As with the previous embodiment, a negative photoresist can be used in place of the positive photoresist. Such photolithographic techniques can be repeated to produce an array of processing material on the substrate for parallel processing.

It will be readily apparent to those of skill in the art that the foregoing deposition techniques are intended to illustrate, and not restrict, the ways in which the processing materials can be delivered to the substrate. Other delivery techniques known to and used by those of skill in the art can also be used.

In some embodiments, once the array of processing materials have been delivered to predefined regions on the substrate, they can be optionally reacted, either sequentially or simultaneously using a number of different synthetic routes. The processing materials can be reacted using, for example, solution based synthesis techniques, photochemical techniques, polymerization techniques, template directed synthesis techniques, epitaxial growth techniques, by the sol-gel process, by thermal, infrared or microwave heating, by calcination, sintering or annealing, by hydrothermal methods, by flux methods, by crystallization through vaporization of solvent, etc. Other useful reaction techniques will be apparent to those of skill in the art upon review of this disclosure. Moreover, the most appropriate route will depend on the processing steps being carried out, and the selection in any given case will be readily apparent to those of skill in the art. In addition, it will be readily apparent to those of skill in the art that, if necessary, the processing materials can be mixed using, for example, ultrasonic techniques, mechanical techniques, etc. Such techniques can be applied directly to a given predefined region on the substrate or, alternatively, to all of the predefined regions on the substrate in a simultaneous fashion (e.g., the substrate can be mechanically moved in a manner such that the materials are effectively mixed).

Solid state reactions at lower temperatures, such as those disclosed in U.S. Pat. No. 5,985,356, in which materials are deposited on the substrate in the form of very thin-films or, alternatively, by using solution based synthesis techniques wherein the reactants are delivered to the substrate in the form of a solution can also be used.

Furthermore, the array of process materials can be processed between the various delivery steps. For example, material A can be delivered to a first region on a substrate and, thereafter, exposed to oxygen at elevated temperature, for example. Subsequently, material B can be delivered to the first region on the substrate and, thereafter, reacted under a set of reaction conditions. Other manipulations and processing steps which can be carried out between the various delivery steps will be apparent to those of skill in the art upon reading this disclosure.

It will be readily apparent to those of skill in the art that the foregoing routes are intended to illustrate, and not restrict, the ways in which the processing material can be processed to form at least two differentially processed regions on a single substrate. Other routes and other modifications known to and used by those of skill in the art can also be used.

Methods for Screening the Array of Materials

Once processed, the regions of the substrate can be screened either sequentially or simultaneously for properties of interest. Either the entire array or, alternatively, a section thereof (e.g., a row of predefined regions) can be screened in parallel for properties of interest.

Accordingly, in one embodiment, the array of regions on a single substrate is processed such that at least two regions are processed differently from each other, and preferably all of the regions of the substrate are processed differently from each other. By processing the array of regions on a single substrate, screening the array of regions for a property of interest is more easily carried out. Properties which can be screened for include, for example, electrical, thermal, mechanical, morphological, optical, magnetic, chemical composition, chemical reactivity, physical properties, magnetic properties, mechanical properties, etc.

The properties of the regions of the substrate can be screened for using conventional methods and devices known to and used by those of skill in the art. In one embodiment, screening includes determining a property of the processed regions for structural properties such as material location, material distribution, material thickness, material step coverage, material continuity, and mechanical properties, such as porosity. In another embodiment, the screening includes parametric testing of the processed regions that includes testing for properties such as yield, via chain yield, line yield, via resistance, line resistance, Kelvin resistance, leakage, and capacitance. In another embodiment, the screening includes device testing of the processed regions, for properties such as operational frequency, switching speed, power dissipation, mobility, transconductance, drive current, threshold voltage, capacitance, resistance, and charge density. In another embodiment, the screening includes reliability testing of the processed regions for a property such as stress migration, electromigration, bias thermal stress, thermal stress, mechanical stress, environmental stress of at least one environmental parameter such as heat, humidity, light and atmosphere, and time dependent dielectric breakdown.

The arrays of the processed regions of the present invention can be screened sequentially or, alternatively, they can be screened in parallel using various analytical techniques, such as atomic force microscopy, X-ray fluorescence, total reflection X-ray fluorescence, X-ray reflectivity, diffraction, electron diffraction, X-ray diffraction, X-ray photoelectron spectroscopy, auger electron spectroscopy, optical microscopy, scanning electron microscopy, FTIR/RAMAN spectroscopy, ellipsometry, reflectometry, contact angle, adhesion testing (e.g., stud pull test, MELT, and 4-point bend test), sheet resistance, acoustical spectroscopy, ultrasonic spectroscopy, streaming potential, angle-resolved X-ray photoelectron spectroscopy, atomic emission spectroscopy, and UV photoelectron spectroscopy. In addition to the foregoing analysis techniques, techniques of the type known in the semiconductor industry can be used, such as parametric testing, reliability testing or other techniques.

It will be readily apparent to those of skill in the art that the foregoing detection systems are intended to illustrate, and not restrict, the ways in which the array of differentially processed regions can be screened for useful properties. Other detection systems known to and used by those of skill in the art can similarly be used.

Example

The following examples are provided to illustrate the efficacy of the inventions herein.

Electroless Deposition of Cobalt Alloy Copper Capping Layers

This example illustrates a combinatorial processing approach to discovering new materials, processes and/or process sequence integration schemes to address electromigration issues by facilitating formation of a cobalt capping layer on electrically conductive portions of a region separated by a dielectric portion, as described in co-pending U.S. patent application Ser. No. 11/132,841, entitled "Formation Of A Masking Layer On A Dielectric Region To Facilitate Formation Of A Capping Layer On Electrically Conductive Regions Separated By The Dielectric Region", filed on May 18, 2005, U.S. patent application Ser. No. 11/132,817, entitled "Formation Of A Masking Layer On A Dielectric Region To Facilitate Formation Of A Capping Layer On Electrically Conductive Regions Separated By The Dielectric Region", filed on May 18, 2005, and U.S. patent application Ser. No. 11/231,047, entitled "Substrate Processing Using Molecular Self-Assembly", filed on Sep. 19, 2005, the contents of which are herein incorporated by reference in their entirety. The site-isolated multiprocessing methods and systems described in the present invention can be used to examine variations in one or more of the unit process steps listed below, sequencing of the processes, and combinations thereof, such that two or more regions of a substrate effectively receive a different process or sequence of processes, or processing history.

Figure 10A:
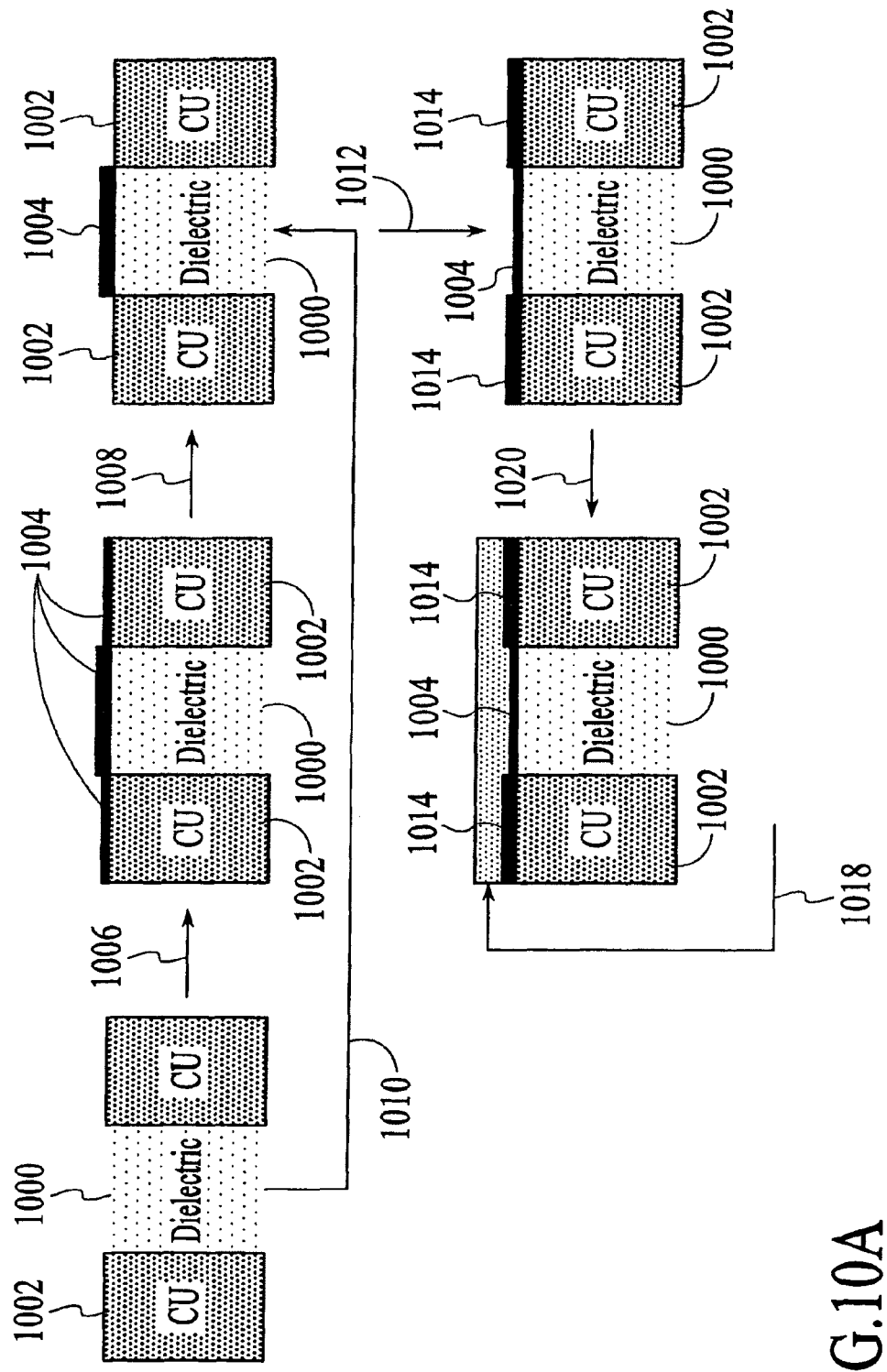
FIGS. 10A and 10B illustrate two exemplary workflows for the deposition of a masking layer to a dielectric portion of a region and a capping layer to an electrically conductive portion of a region.

FIG. 10A shows an exemplary workflow of one embodiment for the approach. A region of a substrate includes at least a dielectric portion (such as $SiO_2$, SiCOH, SiOC, SiCO, SiC, SiCN, etc.) 1000 and an electrically conductive portion (such as copper or copper oxide) 1002. After cleaning, a masking layer 1004 is formed at least on the dielectric portion 1000 of the region. In one embodiment, the region is processed in such a way that the masking layer 1004 forms on all portions of the region (shown by step 1006), but is easily removable from the electrically conductive portions 1002 of the region (shown by step 1008) resulting in a masking layer 1004 on only the dielectric portion 1000 of the region. In another embodiment, the region is processed so that the masking layer 1004 is selective only to the dielectric portion 1000 of the region and forms a layer only on the dielectric portion 1000 of the region (as shown by step 1010). An electroless cobalt (Co) alloy deposition process 1012 then deposits a capping layer (such as CoW, CoWP, CoWB, CoB, CoBP, CoWBP, Co containing alloys, etc.) 1014 on the electrically conductive portions 1002 of the region wherein the masking layer 1004 inhibits capping layer 1014 formation over the dielectric portion 1000 of the region. In one embodiment, after formation of the masking layer 1004, a dielectric barrier layer 1018 (such as, silicon nitride, silicon carbide, silicon carbon nitride, etc.) is subsequently formed on top of the capping layer 1014 and masking layer 1004.

Figure 10B:
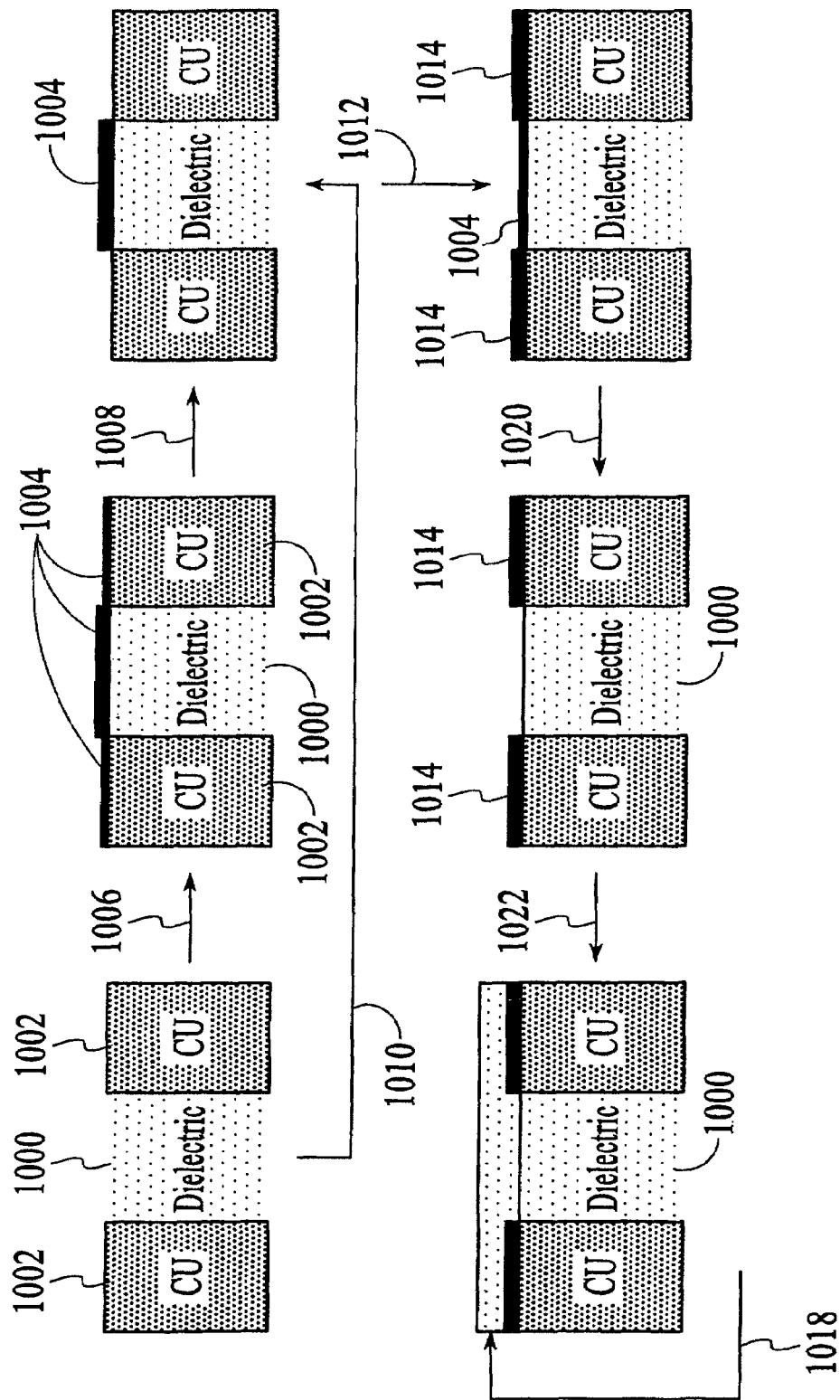

In another embodiment, as illustrated in FIG. 10B, after formation of the capping layer 1014 by the electroless alloy deposition 1012, the masking layer 1004 is subsequently removed 1020 from the dielectric portion 1000 thereby removing any unwanted capping layer residue which may otherwise have formed over the dielectric portion 1000. In this fashion, the effective selectivity of the capping layer formation on the conductive portion(s) 1002 relative to the dielectric portion(s) 1000 is improved. In one embodiment, after removal of the sacrificial masking layer 1004, a dielectric barrier layer 1018 (such as silicon nitride, silicon carbide, silicon carbon nitride, etc.) is subsequently formed 1022 on top of the capping layer 1014 and dielectric portion(s) 1000.

Thus, the unit process steps involved with the above-referenced approach include for example:
1. delivering cleaning solution(s) to remove organic and metallic contamination from exposed dielectric surfaces;
2. delivering cleaning and/or reducing solution(s) to remove the copper oxide and contamination from exposed copper surfaces;
3. delivering wetting, functionalization, and/or organic coating agents to form a masking layer on the dielectric portions of the substrate;
4. delivering and effecting a multicomponent (including but limited to Co containing agents, transition metal containing agents, reducing agents, pH adjusters, surfactants, wetting agents, DI water, DMAB, TMAH, etc.) plating chemistry for electroless plating of a Co containing film;
5. delivering post plate etching and/or cleaning solution(s) to remove the sacrificial masking layer whereby excess plating material, such as Co particulates and other unwanted contamination which would otherwise have formed over the dielectric region(s) are removed through the removal of the masking layer
6. delivering post cleaning solution(s) to remove contamination and/or excess plating material, such as Co particulates from the capping layer;
7. rinsing the region; and
8. drying the region.

The site-isolated multiprocessing apparatus described above can be used to examine variations in each of the unit processes listed above, sequencing of the processes, and combinations thereof such that each region of die effectively receives a different process or processing history.

Integration of Porous Low-K Dielectrics

This example illustrates a combinatorial processing approach to discovering new materials/processes/process sequence integration schemes to address the sealing of porous low-k dielectrics used in damascene (single or dual) copper interconnect formation as described in co-pending U.S. Patent Application No. 60/630,485, entitled "Using A Molecularly Self-Assembled Layer To Create A Diffusion Barrier And/Or Adhesion Layer Between Metal And Dielectric Materials", filed on Nov. 22, 2004, the contents of which are herein incorporated by reference in their entirety. Porous low-k dielectrics are susceptible to precursor penetration during barrier layer formation such as in atomic layer deposition (ALD) processes which can lead to poisoning of the low-k dielectric, the inability to form a continuous barrier layer, the inability to form a thin and continuous barrier layer, etc., all of which can subsequently lead to poor device performance. Porous low-k dielectrics also typically exhibit poor (i.e. weaker) adhesion characteristics to barrier layers (e.g. Ta, $Ta_xC_y$, $Ta_xN_y$, $Ta_xC_yN_z$, W, $W_xC_y$, $W_xN_y$, $W_xC_yN$, Ru, etc.) as compared to standard dielectrics (e.g. SiO2, FSG, etc.) which can lead to poor device reliability. It is desirable to be able to seal the exposed pores of porous low-k dielectrics and/or improve the adhesion properties of porous low-k dielectrics to barrier layers used in copper interconnect formation.

The unit process steps (involved with the above-referenced approach) for sealing of porous low-k dielectrics used in copper interconnect formation include for example:
1. delivering cleaning solution(s) to remove organic and metallic contamination from exposed dielectric surfaces;
2. delivering cleaning and/or reducing solution(s) to remove the copper oxide and contamination from exposed copper surfaces;
3. delivering wetting, functionalization, and/or coating agents to selectively form a molecularly self-assembled layer(s) on the exposed dielectric surfaces so as to substantially fill and/or seal the exposed pores of the exposed dielectric surfaces;
4. delivering cleaning solution(s) to remove contamination and/or residue (resulting from step 3) from exposed copper surfaces;
5. rinsing the region;
6. drying the region; and
7. performing post-processing treatment, e.g. thermal, UV, IR, etc.

The site-isolated multiprocessing methods and systems described in the present invention can be used to examine variations in one or more of the unit process steps listed above, sequencing of the processes, and combinations thereof, such that two or more regions of a substrate effectively receive a different process or sequence of processes, or processing history.

The present invention provides greatly improved methods and apparatus for the differential processing of regions on a single substrate. It is to be understood that the above description is intended to be illustrative and not restrictive. Many embodiments and variations of the invention will become apparent to those of skill in the art upon review of this disclosure. Merely by way of example a wide variety of process times, process temperatures and other process conditions may be utilized, as well as a different ordering of certain processing steps. The scope of the invention should, therefore, be determined not with reference to the above description, but instead should be determined with reference to the appended claims along with the full scope of equivalents to which such claims are entitled.

The explanations and illustrations presented herein are intended to acquaint others skilled in the art with the invention, its principles, and its practical application. Those skilled in the art may adapt and apply the invention in its numerous forms, as may be best suited to the requirements of a particular use. Accordingly, the specific embodiments of the present invention as set forth are not intended as being exhaustive or limiting of the invention.

What is claimed is:

1. A method of combinatorial processing, comprising:
receiving a substrate comprising regions wherein a structure is defined within each of the regions, the structure being a partially completed photonic device, optoelectronic device, or a solar cell; and
combinatorially processing the regions on the substrate in a site-isolated manner through a gas-phase chemical process selected from the group of processes consisting of physical vapor deposition, chemical vapor deposition, and atomic layer deposition to complete the structures in each of the regions to an extent sufficient for optical or electrical screening of the structures.

2. The method of claim 1, wherein the substrate comprises a material selected from the group consisting of: silicon, an inorganic glass, a silica, a silica-based material, and a metal.

3. The method of claim 1, further comprising processing the regions on the substrate using a wet processing technique before combinatorially processing the regions on the substrate in the site-isolated manner through a dry vacuum deposition process.

4. The method of claim 3, wherein the processing using the wet processing technique is combinatorial processing of the regions.

5. The method of claim 3, wherein the wet processing technique comprises etching.

6. The method of claim 5, wherein the wet processing technique further comprises surface modification of the substrate before etching.

7. The method of claim 3, wherein the wet deposition technique comprises an electroless process.

8. The method of claim 1, further comprising processing the regions to prepare an exposed surface of the structures for subsequent processing of the exposed surface.

9. The method of claim 8, wherein the processing to prepare an exposed surface is one of etch, removal, cleaning or surface modification processes.

10. The method of claim 8, wherein the processing does not deposit a film.

11. The method of claim 1, further comprising screening the site-isolated regions using an optical screening technique on the substrate.

12. The method of claim 11, wherein the optical screening technique comprises the technique selected from the group consisting of: reflectometry, diffraction, X-ray reflectivity and X-ray diffraction.

13. The method of claim 11, wherein the optical screening occurs after combinatorially processing the regions on the substrate.

14. The method of claim 1, further comprising screening the site-isolated regions using atomic force microscopy.

15. The method of claim 14, wherein applying the etchant is performed combinatorially.

16. The method of claim 1, further comprising, before receiving the substrate:
depositing a thin film through a physical mask by a physical vapor deposition process to create the regions on the substrate; and
applying an etchant to the substrate to create the partially completed device.

17. The method of claim 16, wherein depositing the thin film is performed combinatorially.

18. The method of claim 1, further comprising, before receiving the substrate:
depositing a thin film on the substrate by physical vapor deposition;
etching the substrate in an isolated manner to form the regions on the substrate,
wherein the etching is varied combinatorially.

19. The method of claim 18, wherein depositing the thin film on the substrate comprises depositing a blanket thin film on the substrate.

* * * * *

UNITED STATES PATENT AND TRADEMARK OFFICE
CERTIFICATE OF CORRECTION

PATENT NO. : 7,871,928 B2
APPLICATION NO. : 12/435332
DATED : January 18, 2011
INVENTOR(S) : Chiang et al.

Page 1 of 1

It is certified that error appears in the above-identified patent and that said Letters Patent is hereby corrected as shown below:

On Title Page item (56)
IN OTHER PUBLICATIONS:

On Page 2, Column 2, line 7, change "May 9, 2010." to --March 9, 2010.--

Signed and Sealed this
Twenty-sixth Day of August, 2014

Michelle K. Lee
*Deputy Director of the United States Patent and Trademark Office*